US012777804B2

(12) United States Patent
Feng et al.

(10) Patent No.: US 12,777,804 B2
(45) Date of Patent: Oct. 27, 2026

(54) DISPLAY PANEL, MAINTENANCE METHOD THEREFOR AND DISPLAY APPARATUS

(71) Applicants: Hefei BOE Joint Technology Co., Ltd., Hefei (CN); BOE Technology Group Co., Ltd., Beijing (CN)

(72) Inventors: Xuehuan Feng, Beijing (CN); Yongqian Li, Beijing (CN)

(73) Assignees: Hefei BOE Joint Technology Co., Ltd., Hefei (CN); Beijing BOE Technology Development Co., Ltd., Beijing (CN)

( * ) Notice: Subject to any disclaimer, the term of this patent is extended or adjusted under 35 U.S.C. 154(b) by 57 days.

(21) Appl. No.: 18/700,145

(22) PCT Filed: Aug. 19, 2022

(86) PCT No.: PCT/CN2022/113679

§ 371 (c)(1),
(2) Date: Apr. 10, 2024

(87) PCT Pub. No.: WO2024/036620

PCT Pub. Date: Feb. 22, 2024

(65) Prior Publication Data

US 2025/0241156 A1 Jul. 24, 2025

(51) Int. Cl.
*H10K 59/131* (2023.01)
*H10K 59/12* (2023.01)
(Continued)

(52) U.S. Cl.
CPC ..... *H10K 59/1315* (2023.02); *H10K 59/1201* (2023.02); *H10K 59/351* (2023.02); *H10K 71/861* (2023.02)

(58) Field of Classification Search
CPC ........... H10K 59/1315; H10K 59/1201; H10K 59/351; H10K 71/861; H10K 59/131; G02F 1/136
See application file for complete search history.

(56) References Cited

U.S. PATENT DOCUMENTS

2015/0123107 A1* 5/2015 Choi .................... G09G 3/3233 438/23
2015/0277197 A1* 10/2015 Chen ................ G02F 1/136259 438/4

(Continued)

FOREIGN PATENT DOCUMENTS

CN 101446724 A 6/2009
CN 101887179 A 11/2010

(Continued)

*Primary Examiner* — Amit Chatly
(74) *Attorney, Agent, or Firm* — IPro, PLLC

(57) ABSTRACT

Disclosed are a display panel, a maintenance method therefor and a display apparatus. The display panel is provided with a display area, and the display panel includes: a plurality of signal lines in the display area; maintenance lines in the display area, extension directions of the maintenance lines and the signal lines being the same, and the maintenance lines being adjacent to and insulated from the signal lines; and connection bridges in the display area, each maintenance line being electrically connected to at least two connection bridges spaced apart, each connection bridge electrically connected with each maintenance line having an overlapping area with each adjacent signal line, and the connection bridges and the signal lines being arranged in different layers.

18 Claims, 18 Drawing Sheets

(51) Int. Cl.
*H10K 59/35* (2023.01)
*H10K 71/00* (2023.01)

(56) References Cited

U.S. PATENT DOCUMENTS

| | | | | |
|---|---|---|---|---|
| 2016/0189593 | A1* | 6/2016 | Lee | G09G 3/003<br>438/4 |
| 2016/0370675 | A1* | 12/2016 | Ren | G02F 1/134309 |
| 2019/0355802 | A1* | 11/2019 | Shim | G09G 3/3233 |
| 2021/0143373 | A1* | 5/2021 | Kim | H10K 50/131 |
| 2022/0085133 | A1* | 3/2022 | Yuan | G02F 1/1362 |
| 2022/0208878 | A1* | 6/2022 | Jang | H10K 59/131 |
| 2024/0178135 | A1* | 5/2024 | Hu | G09G 3/3614 |

FOREIGN PATENT DOCUMENTS

| | | | |
|---|---|---|---|
| CN | 107179639 | A | 9/2017 |
| CN | 107367879 | A | 11/2017 |
| CN | 108022553 | A | 5/2018 |
| CN | 108594551 | A | 9/2018 |

* cited by examiner

60

DISPLAY PANEL, MAINTENANCE METHOD THEREFOR AND DISPLAY APPARATUS

CROSS-REFERENCE TO RELATED APPLICATIONS

The application is a National Stage of International Application No. PCT/CN2022/113679, filed Aug. 19, 2022, which is hereby incorporated by reference in its entirety.

TECHNICAL FIELD

The disclosure relates to the technical field of display, in particular to a display panel, a maintenance method therefor and a display apparatus.

BACKGROUND

An organic light emitting diode (OLED) display panel features ultra-small thinness, a wide view angle, active light emission, high brightness, continuous tunability of emitted light colors, a low cost, a fast response, low power consumption, a wide working temperature range, flexible display, etc. Thus, it has become a highly promising next generation display technology gradually.

A display area of the OLED display panel includes signal lines such as gate lines and data lines, which are essential to normal display. Due to the environment and devices in a manufacturing process of the display panel, it is impossible to keep particles out completely, which will risk disconnecting the signal line and produce a high defect rate of the display panel.

SUMMARY

Embodiments of the disclosure provide a display panel, a maintenance method therefor and a display apparatus. A specific solution is as follows.

Embodiments of the disclosure provide a display panel. The display panel has a display area and includes:

- a plurality of signal lines in the display area;
- maintenance lines in the display area, where an extension direction of the maintenance line is identical to an extension direction of the signal line, and the maintenance line and the signal line are arranged adjacent to each other and insulated from each other; and
- connection bridges in the display area, where each of the maintenance lines is at least electrically connected with two of the connection bridges arranged at an interval, each of the connection bridges electrically connected with the maintenance line has an overlapping area with an adjacent signal line, and the connection bridges and the signal lines are arranged in different layers.

In some embodiments, the display panel according to embodiments of the disclosure includes a plurality of sub-pixels that have different emitted light colors and are distributed in an array in the display area, where the maintenance line and the signal line that are arranged adjacent to each other are located in a gap between two adjacent columns of sub-pixels or a gap between two adjacent rows of sub-pixels.

In some embodiments, the display panel according to embodiments of the disclosure includes: data lines extending in a column direction, gate lines extending in a row direction, and a sensing line extending in the row direction, where the data lines and the gate lines are insulated from each other and crossed to define the plurality of sub-pixels, emitted light colors of the sub-pixels in the same column are identical, and emitted light colors of the sub-pixels in the same row include at least three types of colors; and the signal line is at least one of the data line, the gate line and the sensing line.

In some embodiments, in the display panel according to embodiments of the disclosure, the sub-pixels in the same column are electrically connected with the same data line, and sub-pixels in different columns are electrically connected with different data lines; and

- two data lines electrically connected with two adjacent columns of sub-pixels are located in a gap between the two adjacent columns of sub-pixels, one maintenance line is arranged between the two data lines located in the same gap, and each of connection bridges electrically connected with the maintenance line that is located between the two data lines has overlapping areas with the two data lines.

In some embodiments, in the display panel according to embodiments of the disclosure, the sub-pixels include red sub-pixels, green sub-pixels, blue sub-pixels and white sub-pixels, and a red sub-pixel column, a white sub-pixel column, a blue sub-pixel column and a green sub-pixel column are sequentially arranged in the row direction;

- two data lines electrically connected with the red sub-pixel column and the white sub-pixel column that are adjacent are located in a gap between the red sub-pixel column and the white sub-pixel column that are adjacent; and
- two data lines electrically connected with the blue sub-pixel column and the green sub-pixel column that are adjacent are located in a gap between the blue sub-pixel column and the green sub-pixel column that are adjacent.

In some embodiments, in the display panel according to embodiments of the disclosure, two gate lines are arranged between two adjacent rows of sub-pixels, one maintenance line is arranged between the two gate lines, and each of connection bridges electrically connected with the maintenance line that is located between the two gate lines has overlapping areas with the two gate lines.

In some embodiments, in the display panel according to embodiments of the disclosure, the plurality of sub-pixels are divided into a plurality of pixel units; each of pixel units includes sub-pixels in at least three different colors, and each column of the pixel units is electrically connected with the same sensing line; and the sensing line is located in a gap between two adjacent columns of sub-pixels, and the maintenance line and the connection bridge that are adjacent are arranged in the gap where the sensing line is located.

In some embodiments, in the display panel according to embodiments of the disclosure, the sensing line and the data line are located in the same gap between two adjacent rows of sub-pixels, one maintenance line is arranged between the sensing line and the data line that are located in the same gap, and each of connection bridges electrically connected with the maintenance line that is located between the sensing line and the data line that are adjacent has overlapping areas with the sensing line and the data line that are adjacent.

In some embodiments, in the display panel according to embodiments of the disclosure, the signal line includes at least two first connection lines and at least one second connection line that are arranged in the extension direction of the signal line and are electrically connected, the second connection line is located between the two first connection lines, the connection bridge has an overlapping area with the second connection line, and the connection bridge and the second connection line are arranged in different layers and insulated from each other.

In some embodiments, the display panel according to embodiments of the disclosure includes a first metal layer, an insulation layer and a second metal layer that are arranged in a stacked manner; where under the condition that the signal line is the data line or the sensing line, the first connection line, the maintenance line and the connection bridge are arranged at the second metal layer, the second connection line is arranged at the first metal layer, and the connection bridge is directly electrically connected with the maintenance line.

In some embodiments, the display panel according to embodiments of the disclosure includes a first metal layer, an insulation layer and a second metal layer that are arranged in a stacked manner; where under the condition that the signal line is the data line or the sensing line, the first connection line, the second connection line and the maintenance line are arranged at the second metal layer, the first connection line and the second connection line are in an integrated structure, the connection bridge is arranged at the first metal layer, and the connection bridge and the maintenance line are electrically connected through a via hole that penetrates the insulation layer.

In some embodiments, the display panel according to embodiments of the disclosure includes a first metal layer, an insulation layer and a second metal layer that are arranged in a stacked manner; where under the condition that the signal line is the gate line, the first connection line and the second connection line are arranged at the first metal layer, and the first connection line and the second connection line are in an integrated structure; the connection bridge is arranged at the second metal layer, and the connection bridge and the maintenance line are electrically connected through a via hole that penetrates the insulation layer; and a portion, overlapping the data line and the sensing line, of the maintenance line is arranged at the first metal layer, and a portion, not overlapping the data line and the sensing line, of the maintenance line is arranged at the second metal layer.

In some embodiments, in the display panel according to embodiments of the disclosure, the signal line includes a plurality of first connection lines and second connection lines that are alternately arranged, and the second connection lines are in one-to-one correspondence to the sub-pixels in position.

In some embodiments, in the display panel according to embodiments of the disclosure, a length of the maintenance line is identical to a length of the signal line.

In some embodiments, in the display panel according to embodiments of the disclosure, the maintenance line includes a plurality of maintenance sub-lines that are independently arranged in one-to-one correspondence to the sub-pixels, and each of sub-maintenance lines is at least electrically connected with the two connection bridges arranged at an interval.

In some embodiments, in the display panel according to embodiments of the disclosure, an extension direction of the connection bridge and the extension direction of the maintenance line are crossed.

Accordingly, embodiments of the disclosure further provide a display apparatus. The display apparatus includes the display panel according to any one described above provided by the embodiment of the disclosure.

Accordingly, embodiments of the disclosure further provide a maintenance method for a display panel. The maintenance method is configured to maintain the display panel according to any one described above provided by the embodiment of the disclosure, and includes:

determining a signal line disconnected, and deenergizing the signal line disconnected; and fusing connection bridges located in overlapping areas between the connection bridges and the signal line disconnected; where the connection bridges that are fused are electrically connected with the signal line disconnected, to connect the signal line disconnected with a maintenance line through the connection bridges.

In some embodiments, the maintenance method according to embodiments of the disclosure further includes, at the time of the fusing the connection bridges, the method further includes:

fusing an insulation layer in the overlapping area between the connection bridges and the signal line disconnected into a via hole; where the connection bridges are electrically connected with the signal line disconnected through the via hole.

In some embodiments, in the maintenance method according to the embodiment of the disclosure, the fusing connection bridges includes:

fusing the connection bridges through laser irradiation.

DETAILED DESCRIPTION

Figure 1:
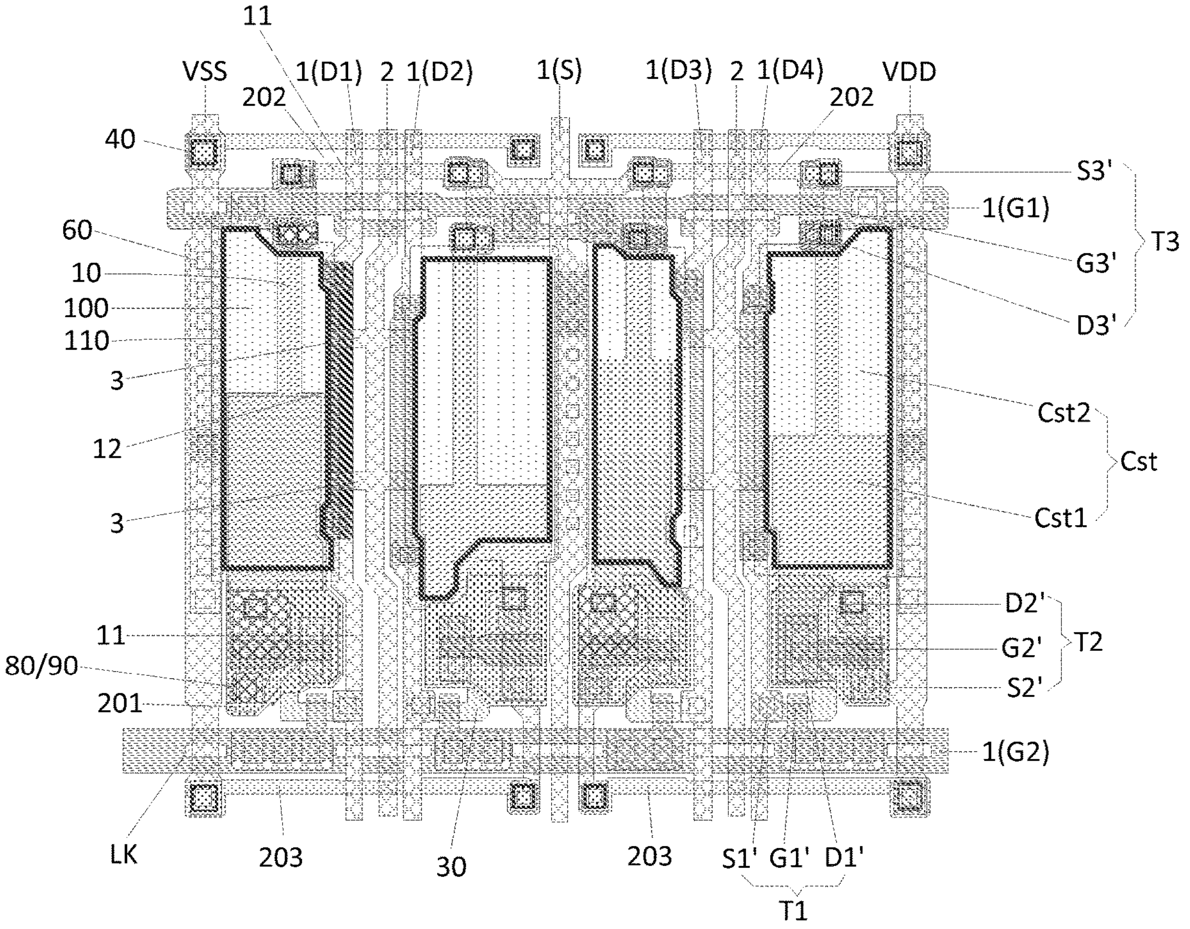
FIG. 1 is a schematic diagram of a layout in which various functional film layers of a display panel are stacked according to an embodiment of the disclosure.

In order to make objectives, technical solutions and advantages of embodiments of the disclosure clearer, the technical solutions of embodiments of the disclosure will be clearly and completely described with reference to accompanying drawings of embodiments of the disclosure. Apparently, the described embodiments are some embodiments rather than all embodiments of the disclosure. In addition, embodiments in the disclosure and features in embodiments can be combined mutually if there is no conflict. All the other embodiments derived by a person of ordinary skill in the art from the described embodiments of the disclosure without creative efforts shall fall within the protection scope of the disclosure.

Unless otherwise defined, technical terms or scientific terms used in the disclosure should have ordinary meanings understandable by a person of ordinary skill in the art to which the disclosure belongs. As used in the disclosure, similar words such as "comprise" or "include" indicate that elements or objects appearing before the word cover elements or objects listed after the word and their equivalents, but do not exclude other elements or objects. Words such as "connection" and "connected" are not limited to physical or mechanical connections, but can include an electrical connection that is direct or indirect. Words such as "inside", "outside", "up" and "down" are merely used to express the relative positional relation. When an absolute position of a described object changes, the relative positional relation can also change accordingly.

It should be noted that a size and a shape of each figure in the accompanying drawings do not reflect true scales, and are merely intended to schematically describe contents of the disclosure. Identical or similar reference numerals denote identical or similar elements, or elements having identical or similar functions throughout.

The embodiment of the disclosure provides a display panel having a display area, as shown in FIGS. 1 to 5. FIGS. 1 to 5 merely show a schematic structural diagram of a part of the display area. The display panel includes:

- a plurality of signal lines 1 located in the display area, where the signal lines 1 may be specifically data lines D1, D2, D3 and D4, gate lines G1 and G2, or a sensing line S;
- maintenance lines 2 located in the display area, where an extension direction of the maintenance line 2 is identical to an extension direction of the signal line 1, and the maintenance line 2 and the signal line 1 are arranged adjacent to each other and insulated from each other; specifically, when the signal line 1 is the data line, the extension direction of the maintenance line 2 is identical to an extension direction of the data line, and the maintenance line 2 and the data line are arranged adjacent to each other and insulated from each other; when the signal line 1 is the gate line, the extension direction of the maintenance line 2 is identical to an extension direction of the gate line, and the maintenance line 2 and the gate line are arranged adjacent to each other and insulated from each other; and when the signal line 1 is the sensing line, the extension direction of the maintenance line 2 is identical to an extension direction of the sensing line, and the maintenance line 2 and the sensing line are arranged adjacent to each other and insulated from each other; and
- connection bridges 3 located in the display area, where each maintenance line 2 is at least electrically connected with two connection bridges 3 arranged at an interval, each of the connection bridges 3 electrically connected with the maintenance line 2 has an overlapping area with an adjacent signal line 1, and the connection bridges 3 and the signal lines 1 are arranged in different layers. Specifically, when the signal line 1 is the data line, each of the connection bridges 3 electrically connected with the maintenance line 2 has an overlapping area with an adjacent data line, and before maintenance, the connection bridge 3 and the data line are arranged in different layers and insulated from each other. When the signal line 1 is the gate line, each of the connection bridges 3 electrically connected with the maintenance line 2 has an overlapping area with an adjacent gate line, and before maintenance, the connection bridge 3 and the gate line are arranged in different layers and insulated from each other. When the signal line 1 is the sensing line, each of the connection bridges 3 electrically connected with the maintenance line 2 has an overlapping area with an adjacent sensing line, and before maintenance, the connection bridge 3 and the sensing line are arranged in different layers and insulated from each other.

According to the display panel provided by the embodiment of the disclosure, the maintenance line that is adjacent to the signal line and insulated from same is arranged in the display area, and each of the connection bridges electrically connected with the maintenance line has the overlapping area with the adjacent signal line. Thus, when the signal line is not disconnected, the connection bridge and the signal line are arranged in different layers and insulated from each other, and a performance of the signal line is not affected. When the signal line is disconnected, the signal line and the connection bridge can be electrically connected by fusing the connection bridge, and the signal line disconnected can be connected through the maintenance line accordingly. Thus, a yield of the display panel can be greatly increased, and the problem of poor detection caused by disconnection of the signal line can be further solved.

In some embodiments, the display panel according to the embodiment of the disclosure includes, as shown in FIGS. 1 to 5, a plurality of sub-pixels (for example, the plurality of sub-pixels include a red sub-pixel R, a green sub-pixel G, a blue sub-pixel B and a white sub-pixel W) that have different emitted light colors and are distributed in an array in the display area. The maintenance line 2 and the signal line 1 that are arranged adjacent to each other are located in a gap between two adjacent columns of sub-pixels or a gap between two adjacent rows of sub-pixels. In this way, the maintenance line 2 and the signal line 1 do not occupy a pixel aperture of the display panel, and an aperture ratio of the display panel is increased.

In some embodiments, the display panel according to embodiments of the disclosure includes, as shown in FIGS. 1 to 5, data lines (D1, D2, D3 and D4) extending in a column direction, gate lines (G1 and G2) extending in a row direction, and a sensing line S extending in the column direction. The data lines (D1, D2, D3 and D4) and the gate lines (G1 and G2) are insulated from each other and crossed to define the plurality of sub-pixels (R, G, B and W), emitted light colors of the sub-pixels in the same column are identical, and emitted light colors of the sub-pixels in the same row include at least three types of colors (with the same row including sub-pixels R, G, B and W as an example).

The signal line 1 may be at least one of the data lines (D1, D2, D3 and D4), the gate lines (G1 and G2) and the sensing lines S. That is, according to a maintenance solution provided by the embodiment of the disclosure, the maintenance line may be merely arranged adjacent to the data line, the maintenance line may be merely arranged adjacent to the gate line, the maintenance line may be merely arranged adjacent to the sensing line, or maintenance lines are arranged adjacent to the data line, the gate line and the sensing line in any combination respectively.

Figure 2:
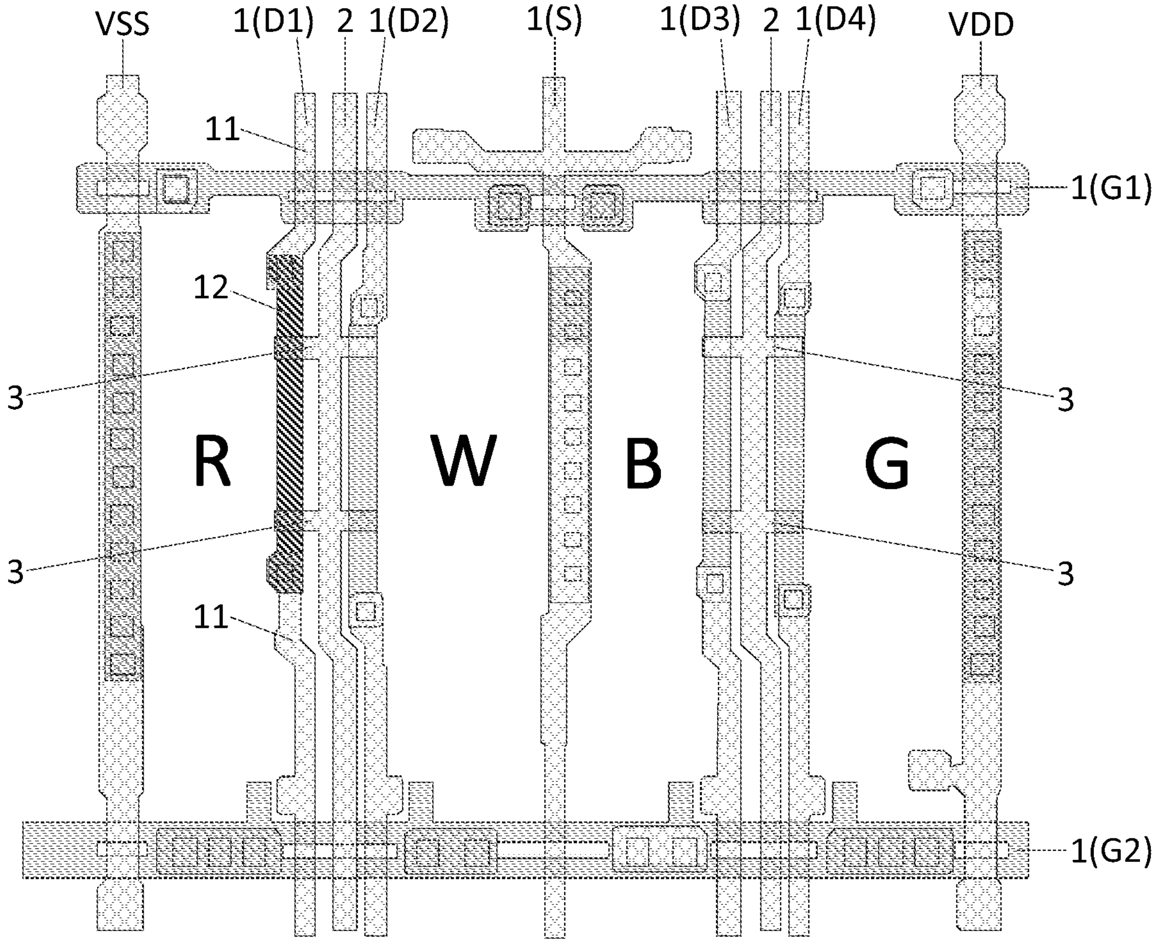
FIG. 2 is a schematic structural diagram of a maintenance line corresponding to a data line in FIG. 1.
Figure 3:
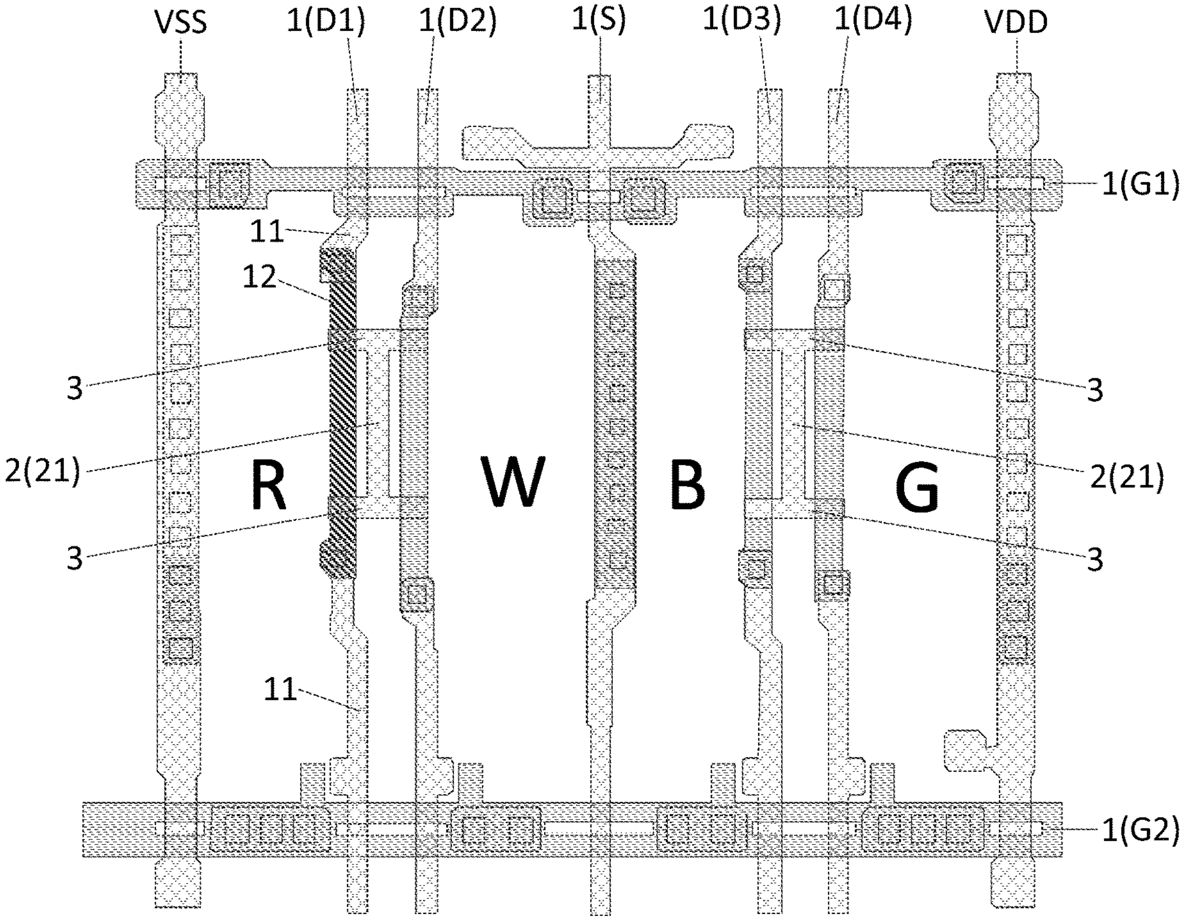
FIG. 3 is another schematic structural diagram of the maintenance line corresponding to the data line in FIG. 1.
Figure 4:
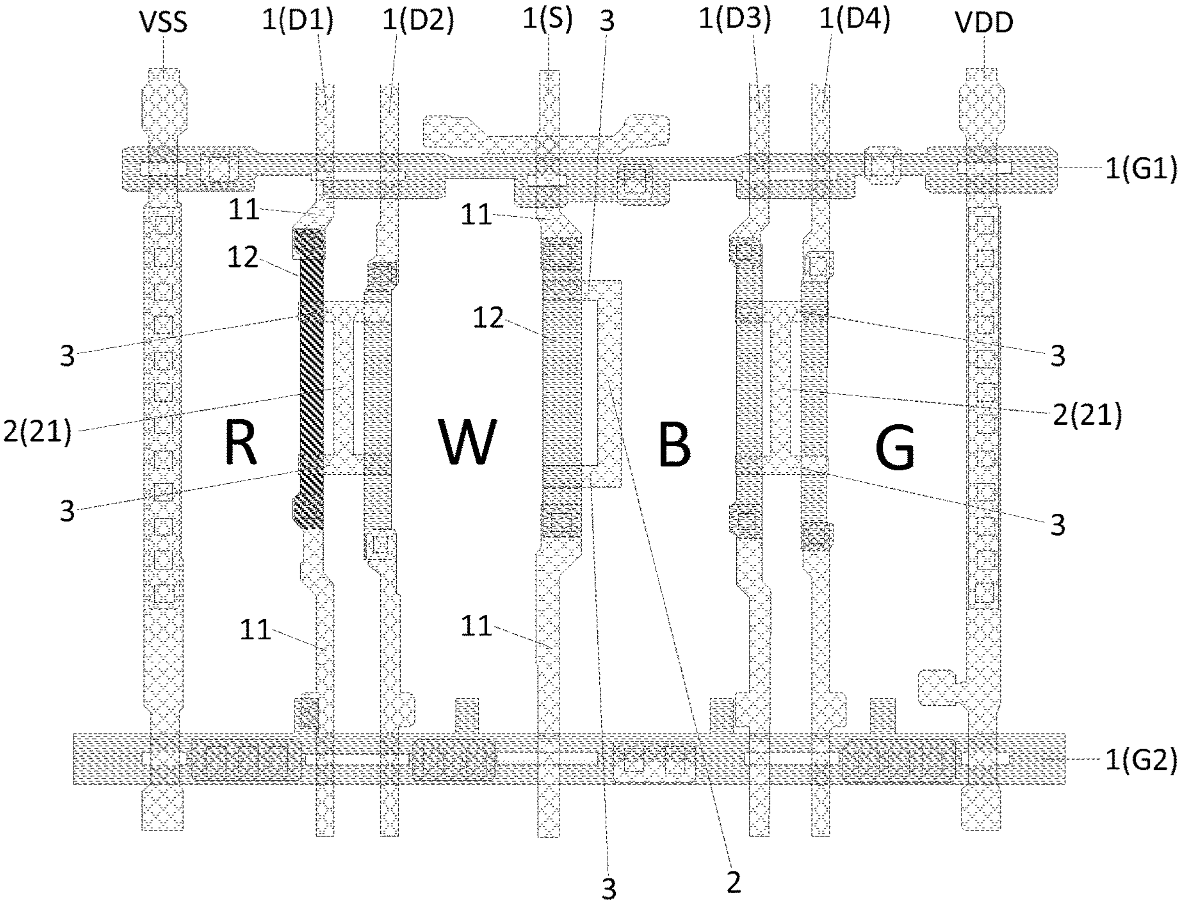
FIG. 4 is a schematic structural diagram of maintenance lines corresponding to a data line and a sensing line respectively.
Figure 5:
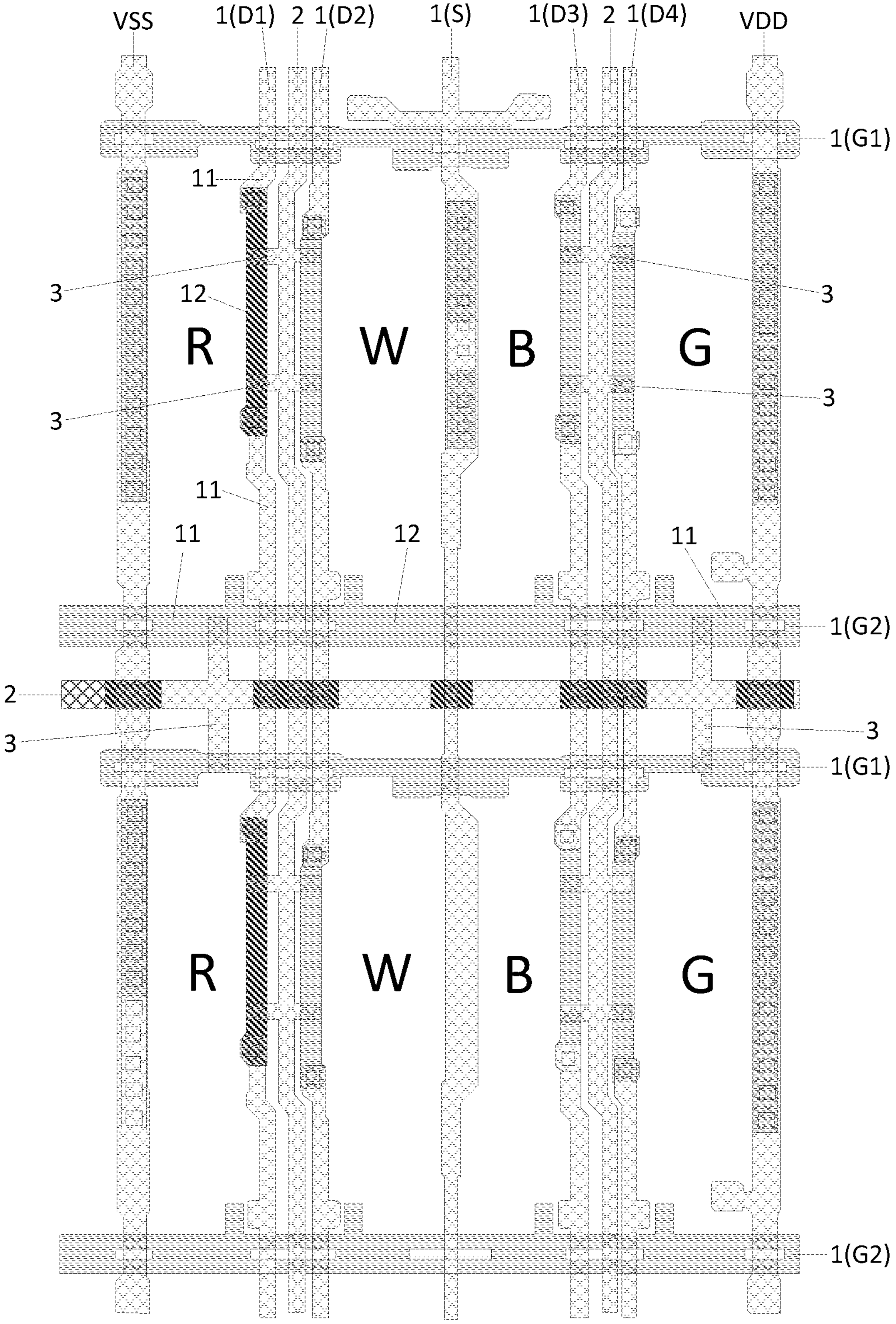
FIG. 5 is a schematic structural diagram of maintenance lines corresponding to a data line and a gate line respectively.

It should be noted that FIG. 1 is a schematic diagram of a layout in which various functional film layers of a display panel are stacked, and FIG. 1 merely shows that the data line is arranged corresponding to the maintenance line 2. In order to clearly show the schematic diagram of the signal lines, the maintenance lines and the connection bridges, FIGS. 2 to 5 merely show schematic structural diagrams of partial film layers in a display panel. FIG. 2 merely shows a schematic structural diagram of a maintenance line corresponding to data line in FIG. 1. FIG. 3 shows another schematic structural diagram of the maintenance line corresponding to the data line. FIG. 4 shows a schematic structural diagram of maintenance lines corresponding to a data line and a sensing line respectively. FIG. 5 shows a schematic structural diagram of maintenance lines corresponding to a data line and a gate line respectively.

It should be noted that this embodiment of the disclosure is a maintenance solution that takes the signal line being the data line, the gate line and the sensing lines as examples, which is not limited thereto certainly. According to the maintenance scheme provided by this embodiment of the disclosure, for all signal lines in the display panel, the maintenance lines and the connection bridges according to this embodiment of the disclosure may be arranged adjacent thereto.

In some embodiments, in the display panel according to the embodiment of the disclosure, the sub-pixels in the same column are electrically connected with the same data line, and sub-pixels in different columns are electrically connected with different data lines.

Specifically, as shown in FIGS. 1 to 5, the sub-pixels (for example, R) in the same column are electrically connected with the same data line D1, the sub-pixels (for example, W) in the same column are electrically connected with the same data line D2, the sub-pixels (for example, B) in the same column are electrically connected with the same data line D3, and the sub-pixels (for example, G) in the same column are electrically connected with the same data line D4.

Figure 6:
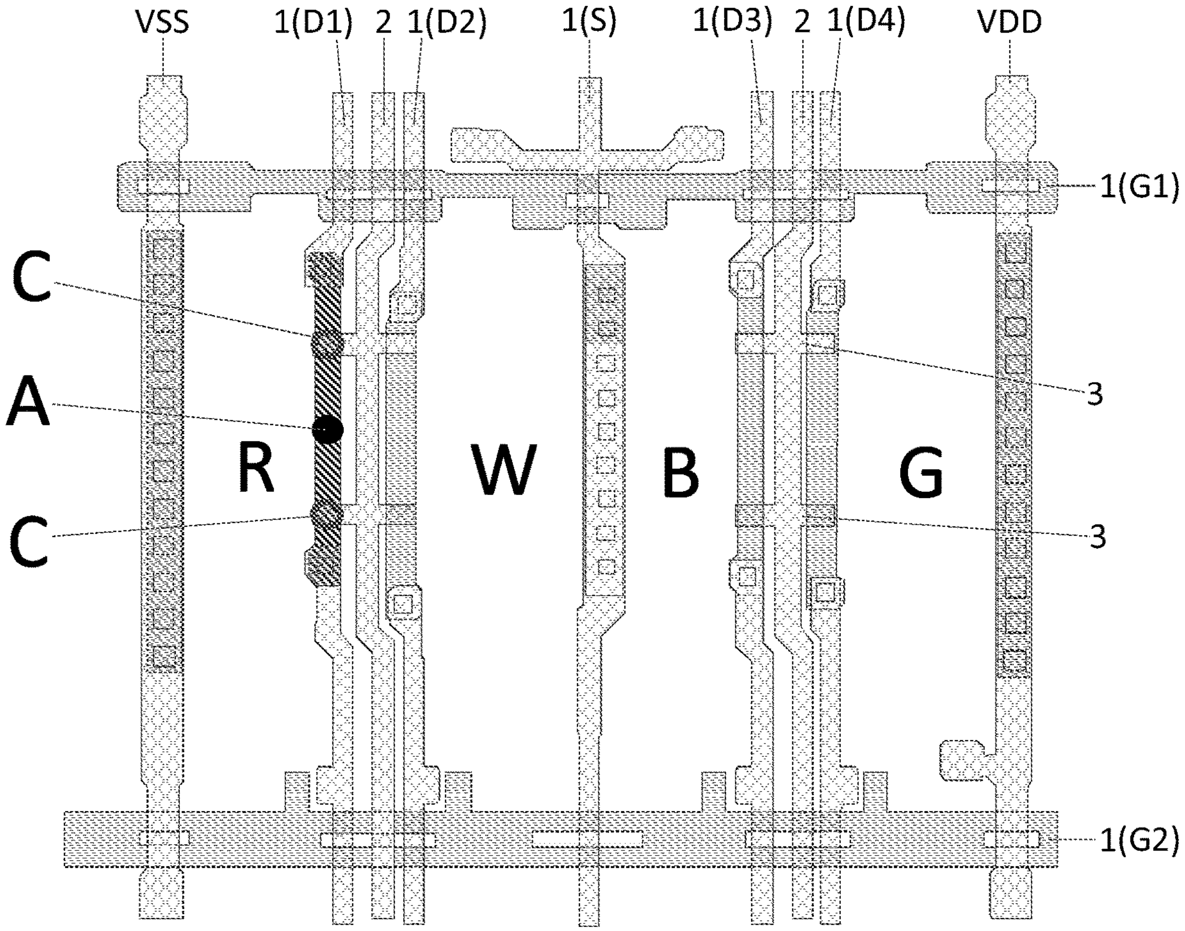
FIG. 6 is a schematic structural diagram of maintaining a data line.

Two data lines (D1 and D2) electrically connected with two adjacent columns of sub-pixels (for example, R and W) are located in a gap between the two adjacent columns of sub-pixels (R and W), one maintenance line 2 is arranged between the two data lines (D1 and D2) located in the same gap, and each of connection bridges 3 electrically connected with the maintenance line 2 that is located between the two data lines (D1 and D2) has overlapping areas with the two data lines (D1 and D2). In this way, when the data line (for example, D1) is disconnected as shown in FIG. 6, when a particle that remains on the data line D1 and is denoted by a black dot A in FIG. 6 leads to disconnection of the data line D1, the data line D1 and the connection bridge 3 may be electrically connected by fusing the connection bridge 3 (a black circle C denotes a position where the data line D1 is electrically connected with the connection bridge 3), and the data line D1 disconnected may be connected through the maintenance line 2 accordingly. Thus, a yield of the display panel can be greatly increased, and the problem of detecting defective products caused by the disconnection of the signal line can be further solved.

It should be noted that, as shown in FIGS. 1 to 5, an insulation layer (to be described later) may be provided between the data line D1 and the connection bridge 3. When the data line D1 is not disconnected, the data line D1 and the connection bridge 3 are insulated from each other. When the data line D1 is disconnected, a portion, corresponding to the overlapping area where the connection bridge 3 and the data line D1 overlap, of the insulation layer is fused into a via hole while the connection bridge 3 is fused, and the connection bridge 3 can be electrically connected with the data line D1 through the via hole accordingly.

It should be noted that FIG. 6 of the embodiment of the disclosure illustrates the maintenance method with the data line D1 as an example, and maintenance methods for other data lines (such as D2, D3 and D4) are identical to the maintenance method for the data line D1.

It should be noted that merely the four data lines D1, D2, D3 and D4 are shown in FIGS. 1 to 5 of embodiments of the disclosure. It is clear that a plurality of data lines can be arranged in the implementation, and a corresponding number of data lines are arranged according to an actual size of the panel, pixel resolution, etc.

In some embodiments, in the display panel according to embodiments of the disclosure as shown in FIGS. 1 to 5, the red sub-pixel R column, the white sub-pixel W column, the blue sub-pixel B column and the green sub-pixel G column are sequentially arranged in the row direction.

Two data lines (D1 and D2) electrically connected with the red sub-pixel R column and the white sub-pixel W column that are adjacent are located in a gap between the red sub-pixel R column and the white sub-pixel W column that are adjacent. Thus, every two columns of the red sub-pixel R column and the white sub-pixel W column that are adjacent can share one maintenance line 2.

Two data lines (D3 and D4) electrically connected with the blue sub-pixel column B and the green sub-pixel column G that are adjacent are located in a gap between the blue sub-pixel B column and the green sub-pixel G column that are adjacent. Thus, every two columns of the blue sub-pixel B column and the green sub-pixel G column that are adjacent can share one maintenance line 2.

In some embodiments, due to the fact not every data line may disconnected in a manufacturing process of the display panel, it is unnecessary to arrange a corresponding maintenance line for each data line. Embodiments of the disclosure adopt a maintenance solution of two-to-one correspondence (two data lines are correspondingly provided with one maintenance line). Thus, the data line can be maintained without occupying a large area of a pixel aperture.

Figure 7:
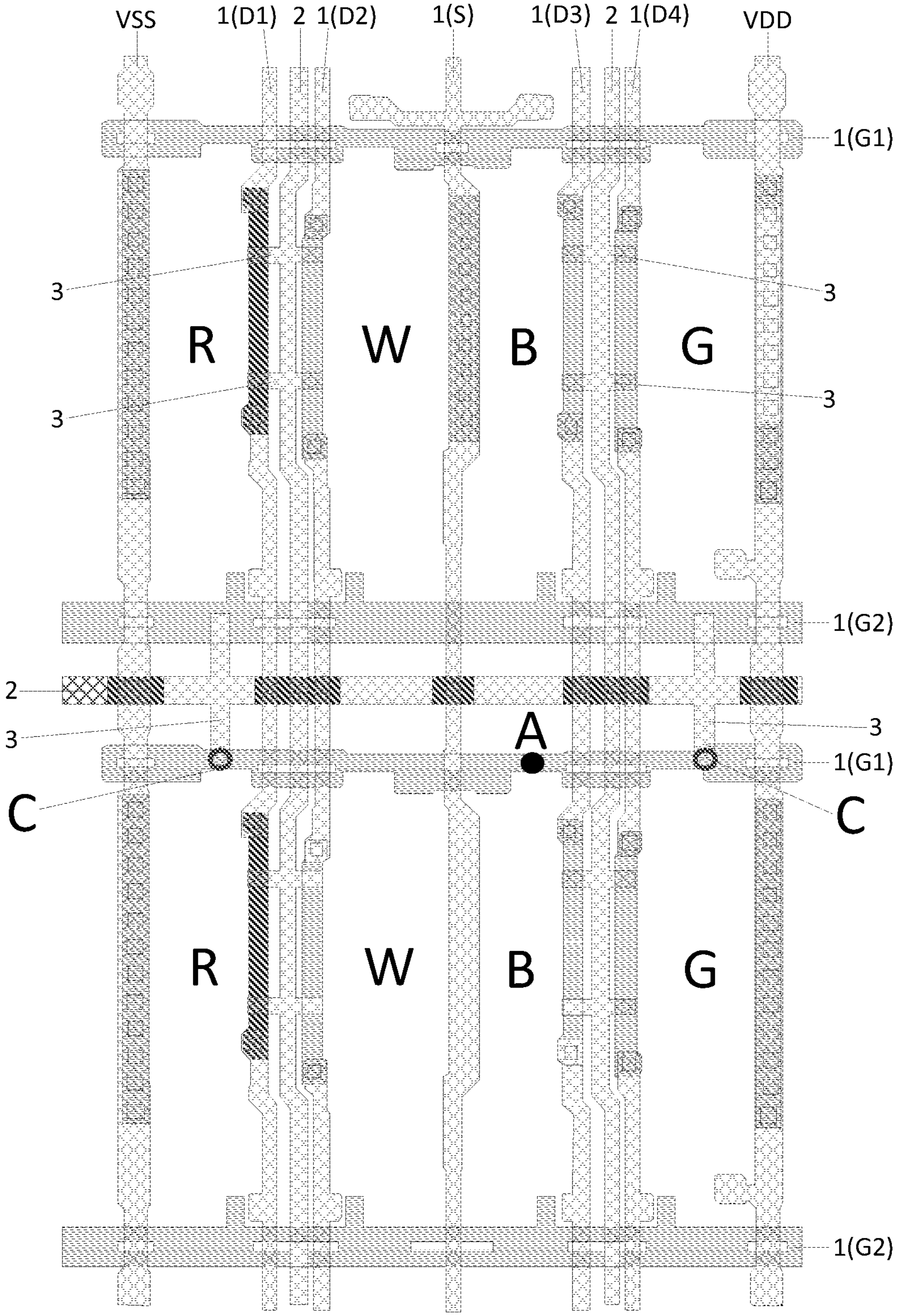
FIG. 7 is a schematic structural diagram of maintaining a gate line.

In some embodiments, in the display panel according to embodiments of the disclosure as shown in FIG. 5, two gate lines (G1 and G2) are arranged between two adjacent rows of sub-pixels, one maintenance line 2 is arranged between the two gate lines (G1 and G2), and each of connection bridges 3 electrically connected with the maintenance line 2 that is located between the two gate lines (G1 and G2) has overlapping areas with the two gate lines (G1 and G2). In this way, when the gate line (for example, G1) is disconnected as shown in FIG. 7, when a particle that remains on the gate line G1 and is denoted by a black dot A in FIG. 7 leads to disconnection of the gate line G1, the gate line G1 and the connection bridge 3 may be electrically connected by fusing the connection bridge 3 (a black circle C denotes a position where the gate line G1 is electrically connected with the connection bridge 3), and the gate line G1 disconnected may be connected through the maintenance line 2 accordingly. Thus, a yield of the display panel can be greatly increased, and the problem of poor detection caused by the disconnection of the signal line can be further solved.

It should be noted that an insulation layer (to be described later) may be provided between the gate line G1 and the connection bridge 3, as shown in FIG. 7. When the gate line G1 is not disconnected, the gate line G1 and the connection bridge 3 are insulated from each other. When the gate line G1 is disconnected, a portion, corresponding to the overlapping area where the connection bridge 3 and the gate line G1 overlap each other, of the insulation layer is fused into a via hole while the connection bridge 3 is fused, and the connection bridge 3 can be electrically connected with the gate line G1 through the via hole accordingly.

It should be noted that FIG. 7 of embodiments of the disclosure describes the maintenance method with the gate line G1 as an example, and a maintenance method for the gate line G2 is identical to the maintenance method for the gate line G1.

It should be noted that merely four gate lines are shown in FIG. 5 of embodiments of the disclosure. It is clear that a plurality of gate lines can be arranged during the implementation, and a corresponding number of gate lines are arranged according to an actual size of the panel, pixel resolution, etc.

Figure 8:
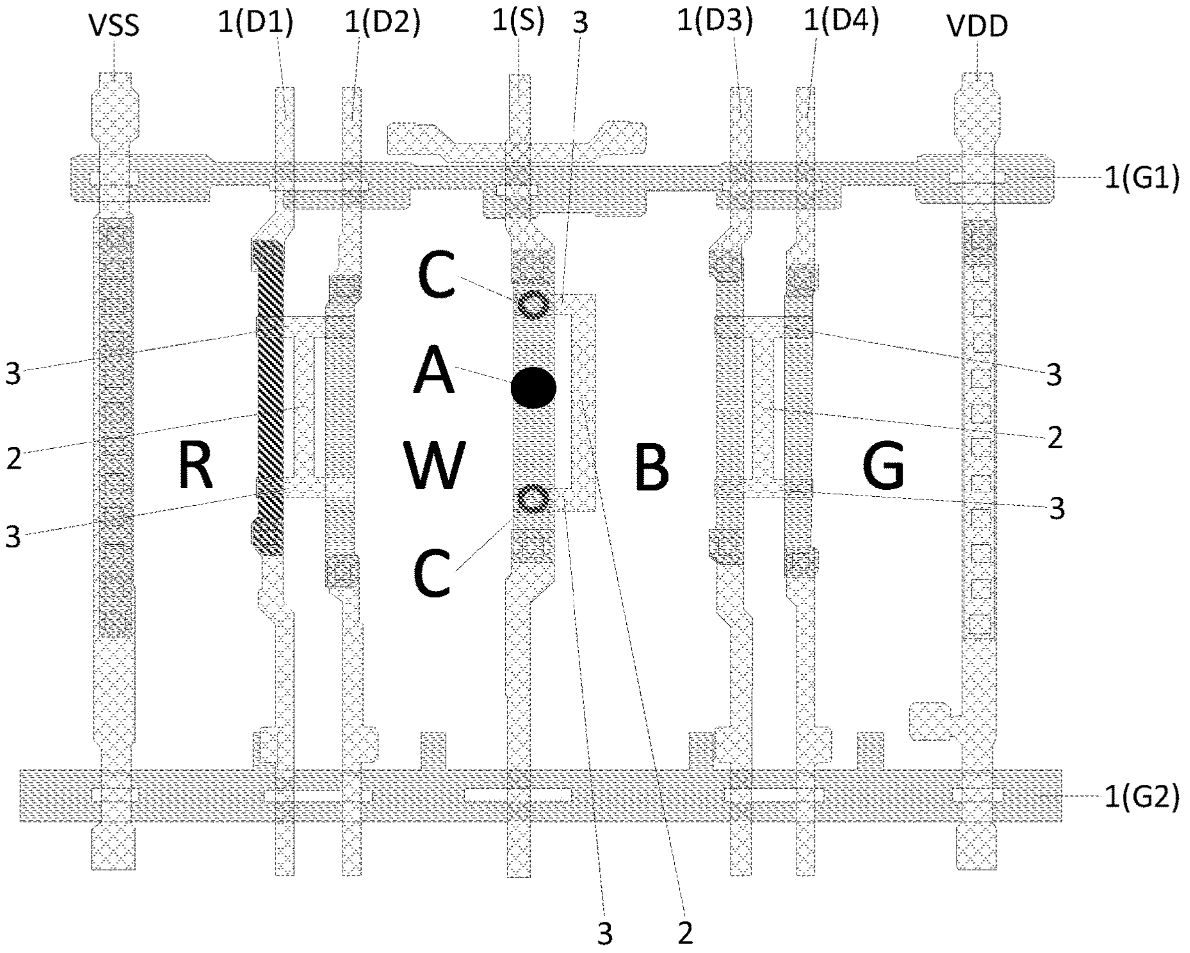
FIG. 8 is a schematic structural diagram of maintaining a sensing line.

In some embodiments, in the display panel according to embodiments of the disclosure as shown in FIG. 4, the plurality of sub-pixels are divided into a plurality of pixel units (for example, each pixel unit includes R, W, B and G sub-pixels, and one pixel unit is shown in FIG. 4). Each pixel unit includes sub-pixels in at least three different colors (each pixel unit includes R, W, B and G sub-pixels in four different colors according to the embodiment of the disclosure), and each column of the pixel unit (that is, an R column, a W column, a B column and a G column that are adjacent) is electrically connected with the same sensing line S. The sensing line S is located in a gap between two adjacent columns of sub-pixels (W and B), and the maintenance line 2 and the connection bridge 3 that are adjacent are arranged in the gap where the sensing line S is located. In this way, when the sensing line S is disconnected as shown in FIG. 8, when a particle that remains on the sensing line S and is denoted by a black dot A in FIG. 8 leads to disconnection of the sensing line S, the sensing line S and the connection bridge 3 may be electrically connected (a black circle C denotes a position where the sensing line S is electrically connected with the connection bridge 3) by fusing the connection bridge 3, and the sensing line S disconnected may be connected through the maintenance line 2 accordingly. Thus, a yield of the display panel can be greatly increased, and the problem of poor detection caused by the disconnection of the signal line can be further solved.

It should be noted that, as shown in FIG. 7, an insulation layer (to be described later) may be provided between the sensing line S and the connection bridge 3. When the sensing line S is not disconnected, the sensing line S and the connection bridge 3 are insulated from each other. When the sensing line S is disconnected, a portion, corresponding to the overlapping area where the connection bridge 3 and the sensing line S overlap, of the insulation layer is fused into a via hole while the connection bridge 3 is fused, and the connection bridge 3 can be electrically connected with the sensing line S through the via hole accordingly.

It should be noted that the display panel according to embodiments of the disclosure will be provided with a plurality of sensing lines. FIG. 8 of the embodiment of the disclosure describes the maintenance method with one of the sensing lines S as an example, and maintenance methods for other sensing lines S are identical as the maintenance method for the sensing lines S shown in FIG. 8.

In some embodiments, as shown in FIGS. 1 to 5, in embodiments of the disclosure, the data line and the sensing line are located in different gaps between two adjacent rows of sub-pixels. It is clear that during the implementation, the sensing line and the data line may also be located in the same gap between two adjacent rows of sub-pixels, one maintenance line is arranged between the sensing line and the data line that are located in the same gap, and each of connection bridges electrically connected with the maintenance line that is located between the sensing line and the data line that are adjacent has overlapping areas with the sensing line and the data line that are adjacent. Since the sensing line and the data line are generally routed in the same metal layer, the sensing line and the data line that are adjacent can share one maintenance line. When the data line is disconnected, the data line disconnected and the connection bridge are electrically connected by fusing the connection bridge, and the data line disconnected is electrically connected through the maintenance line accordingly. When the sensing line is disconnected, the sensing line disconnected and the connection bridge are electrically connected by fusing the connection bridge, and the sensing line disconnected is electrically connected through the maintenance line.

In some embodiments, in the display panel according to embodiments of the disclosure as shown in FIGS. 1 to 5, the signal line 1 includes at least two first connection lines 11 and at least one second connection line 12 that are arranged in the extension direction of the signal line 1 and are electrically connected, the second connection line 12 is located between the two first connection lines 11, the connection bridge 3 has an overlapping area with the second connection line 12, and the connection bridge 3 and the second connection line 12 are arranged in different layers. In this way, the first connection line 11, the maintenance line 2 and the connection bridge 3 may be located in the same metal layer, the second connection line 12 is located in another metal layer, and ends of the first connection line 11 and the second connection line 12 are connected through a via hole by using a jumper wire. Alternatively, the first connection line 11, the second connection line 12 and the maintenance line 2 are all located in the same metal layer, and the connection bridge 3 is located in another metal layer.

In some embodiments, the display panel generally includes a gate metal layer and a source-drain metal layer. The data line and the sensing line are generally arranged in the source-drain metal layer, and the gate line is arranged in the gate metal layer. The display panel according to the embodiment of the disclosure includes a first metal layer (such as the gate metal layer), an insulation layer (an interlayer insulation layer) and a second metal layer (such as the source-drain metal layer) that are stacked.

As shown in FIGS. 1 to 4, under the condition that the signal line 1 is the data line or the sensing line, each of the first connection line 11, the maintenance line 2 and the connection bridge 3 may be located at the second metal layer (the source-drain metal layer), the second connection line 12 is located at the first metal layer (the gate metal layer), and the connection bridge 3 is directly electrically connected with the maintenance line 2. Thus, the connection bridge 3 and the data line and/or the sensing line are arranged in different layers and insulated from each other.

In some embodiments, in FIGS. 1 to 4, a case that each of the first connection line 11, the maintenance line 2 and the connection bridge 3 is located at the second metal layer (the source-drain metal layer) and the second connection line 12 is located at the first metal layer (the ate metal layer) is taken as an example. It is clear that in the display panel according to the embodiment of the disclosure, when the signal line 1 is the data line or the sensing line, each of the first connection line 11, the second connection line 12 and the maintenance line 2 in FIGS. 1 to 4 may be located at the second metal layer (the source-drain metal layer). The first connection line 11 and the second connection line 12 are in an integrated structure, and the connection bridge 3 is located at the first metal layer (the gate metal layer). The connection bridge 3 and the maintenance line 2 are electrically connected through a via hole penetrating the insulation layer (not shown). Thus, the connection bridge 3 and the data line and/or the sensing line may be arranged in different layers and insulated from each other.

In some embodiments as shown in FIG. 5, since the gate line and the data line are crossed, the extension direction of the maintenance line 2 is identical to the extension direction of the gate line, and the maintenance line 2 has the overlapping area with the signal line such as the data line and the sensing line. When the signal line 1 is the gate line, each of the first connection line 11 and the second connection line 12 may be located at the first metal layer (the gate metal layer), the first connection line 11 and the second connection line 2 are in an integrated structure, the connection bridge 3 is located at the second metal layer (the source-drain metal layer), and the connection bridge 3 and the maintenance line 2 are electrically connected through the via hole penetrating the insulation layer (not shown). A portion, overlapping the data line, the sensing line S, a first power supply line VDD (to be introduced later), a second power supply line VSS (to be introduced later), etc., of the maintenance line 2 is located at the first metal layer (the gate metal layer), and a portion, not overlapping the data line and the sensing line S, of the maintenance line 2 is located at the second metal layer (the source-drain metal layer). Thus, the connection bridge 3 and the gate line may be arranged in different layers and insulated from each other.

In some embodiments, due to generally high risk of signal line disconnection in the sub-pixel area, in the display panel according to the embodiment of the disclosure as shown in FIG. 5, the signal line (for example, the data line D1) includes a plurality of first connection lines 11 and second connection lines 12 that are alternately arranged, and the second connection lines 12 are in one-to-one correspondence to the sub-pixels R in position. In this way, when the signal line 1 corresponding to any sub-pixel area is disconnected, the signal line disconnected can be connected through a corresponding maintenance line 2.

In some embodiments, in the display panel according to the embodiment of the disclosure as shown in FIGS. 1, 2 and 5, a length of the maintenance line 2 is identical to a length of the signal line 1. Clearly, as shown in FIGS. 3 and 4, the maintenance line 2 may include a plurality of maintenance sub-lines 21 that are independently arranged in one-to-one correspondence to the sub-pixels, and each of sub-maintenance lines 21 is at least electrically connected with the two connection bridges 3 arranged at an interval. Compared with an arrangement of an entire maintenance line 2, an arrangement of the plurality of sub-maintenance lines 21 can reduce a resistance of the maintenance line 2 improve a signal transmission performance, and further implement repeated maintenance in the case that a plurality of particles fall on one data line.

In some embodiments, in the display panel according to embodiments of the disclosure as shown in FIGS. 1 to 5, an extension direction of the connection bridge 3 and the extension direction of the maintenance line may be crossed in order to make the connection bridge has an overlapping area with each signal line that is adjacent thereto.

In some embodiments, as shown in FIGS. 1 to 5, the connection bridge 3 may have a linear shape. It is clear that the connection bridge is not limited thereto as long as the connection bridge has the overlapping area with the signal line that is adjacent thereto, which should fall within the protection scope of the embodiment of the disclosure.

Figure 9:
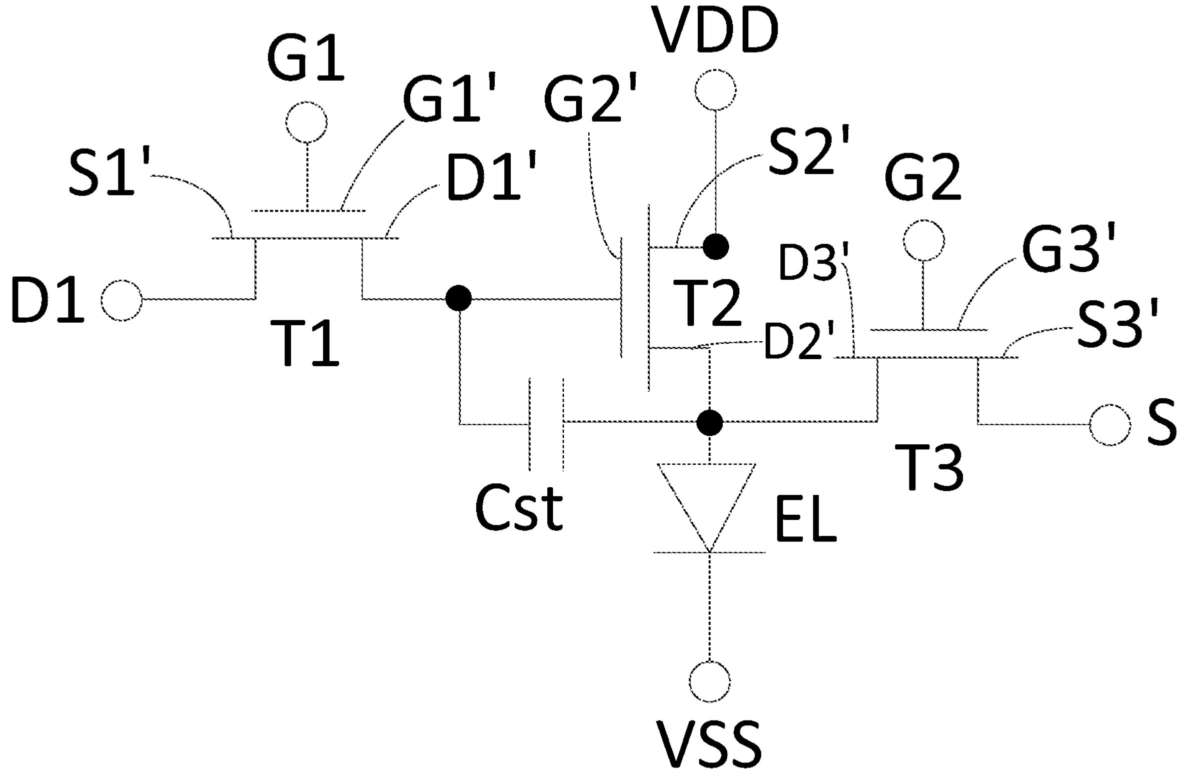
FIG. 9 is a schematic diagram of an equivalent circuit of a drive circuit included in a sub-pixel according to an embodiment of the disclosure.

In some embodiments, in embodiments of the disclosure as shown in FIG. 1, the display panel includes a plurality of sub-pixels (R, G, B, W), and each sub-pixel includes a drive circuit and a light-emitting device. FIG. 9 is an equivalent circuit diagram of the drive circuit shown in FIG. 1, and shows a drive circuit of 3T1C. Each sub-pixel includes a drive circuit and a light-emitting element EL. The drive circuit is electrically connected with the gate line (G1 and G2), the sensing line S, the first power supply line VDD, a second power supply line VSS and the data line (for example, D1). The drive circuit includes a switching transistor T1, a driving transistor T2, a sensing transistor T3 and a storage capacitor Cst. In some embodiments, with the sub-pixel G as an example, a gate G1' of the switching transistor T1 in each drive circuit is connected with the gate line G2, a first electrode S1' of the switching transistor T1 is connected with the data line D4, and a second electrode D1' of the switching transistor T1 is connected with a gate electrode G2' of the driving transistor T2. A first electrode S2' of the driving transistor T2 is connected with the first power supply line VDD, and a second electrode D2' of the driving transistor T2 is connected with an anode of the light-emitting element EL. A gate electrode G3' of the sensing transistor T3 is connected with the gate line G1, a first electrode S3' of the sensing transistor T3 is connected with the sensing line S, and a second electrode D3' of the sensing transistor T3 is connected with the second electrode of the driving transistor T2. A cathode of the light-emitting element EL is connected with the second power supply line VSS, and the light-emitting element EL is configured to emit light with corresponding brightness in response to a current of the second electrode D2' of the driving transistor T2. The sensing transistor T3 may extract a threshold voltage Vth and a mobility of the driving transistor T2 in response to compensation timing, so as to sense the threshold voltage Vth. The storage capacitor Cst is configured to maintain a voltage difference between the gate of the driving transistor T2 and the second electrode of the driving transistor T2 within a light emission period of one frame.

A structure of the drive circuit of 3T1C shown in FIG. 9 will be described in detail in combination with the schematic diagram of the layout for film layers in the display panel.

Figure 10A:
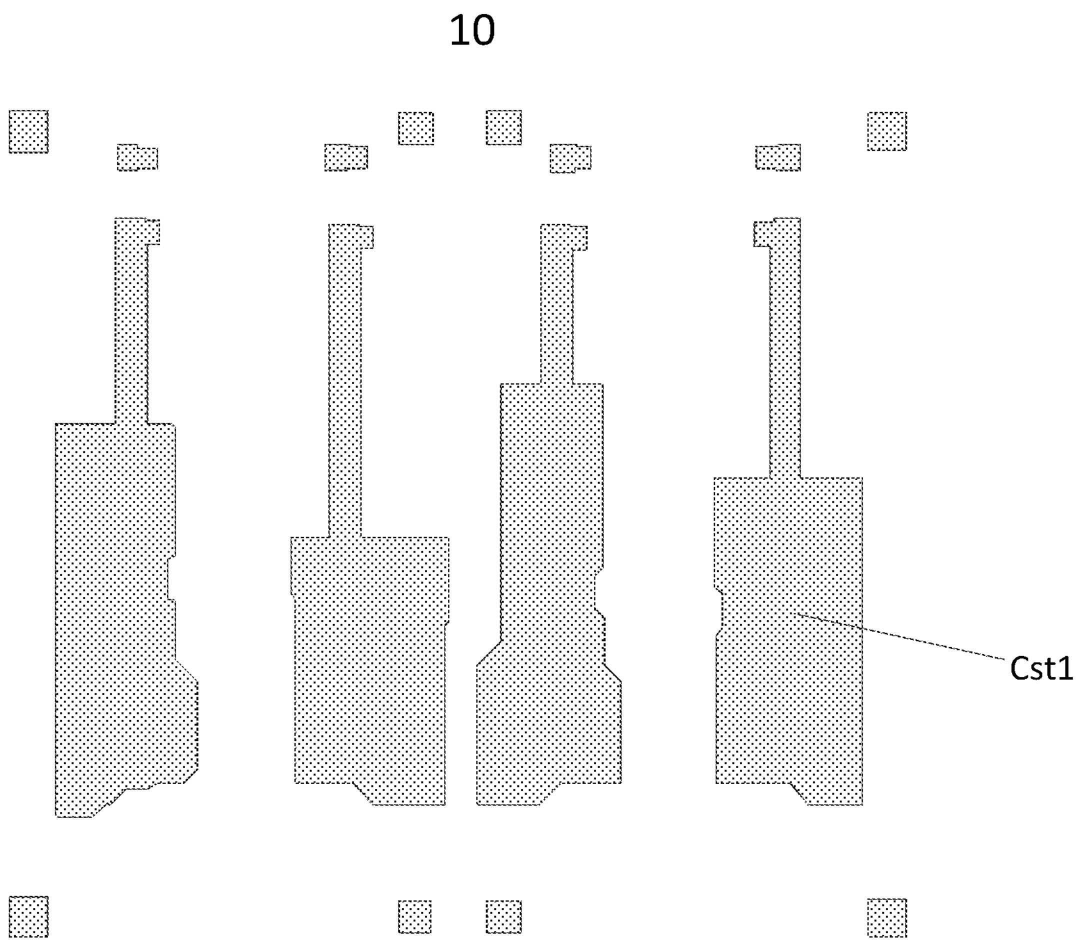
FIGS. 10A to 10K are schematic diagrams of plan views of the film layers in FIG. 1 respectively.
Figure 10B:
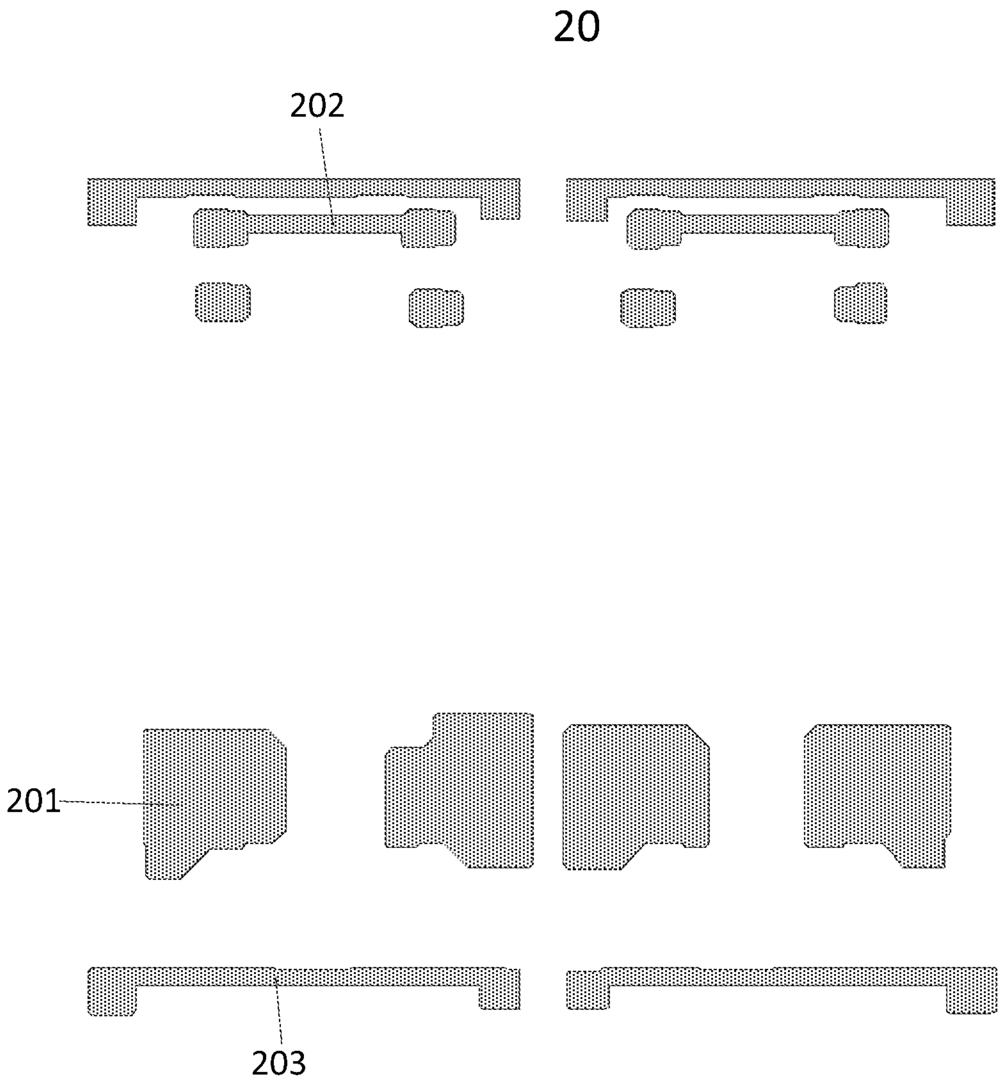
Figure 10C:
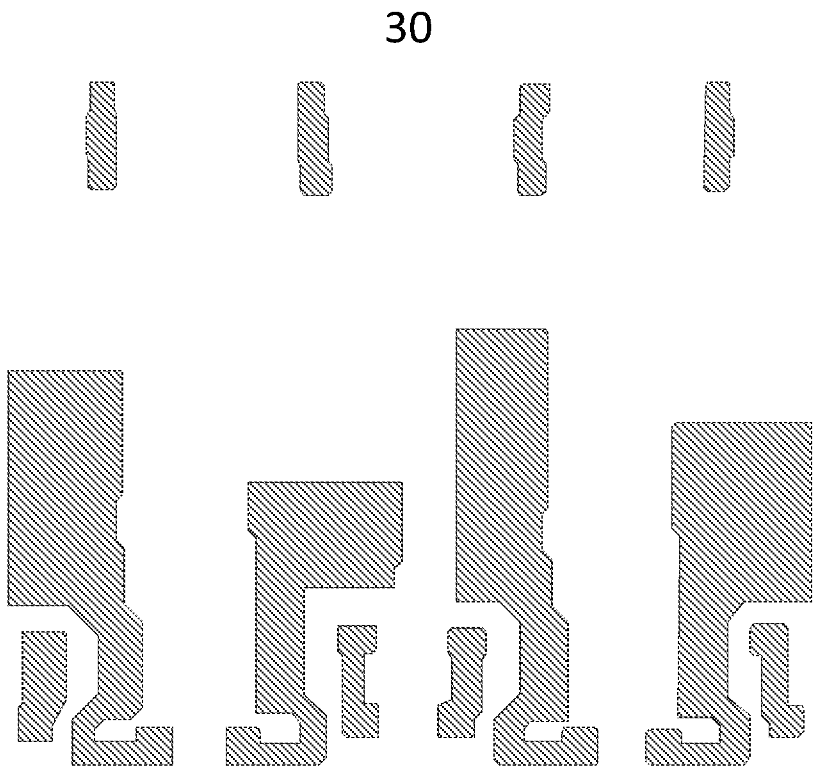
Figure 10D:
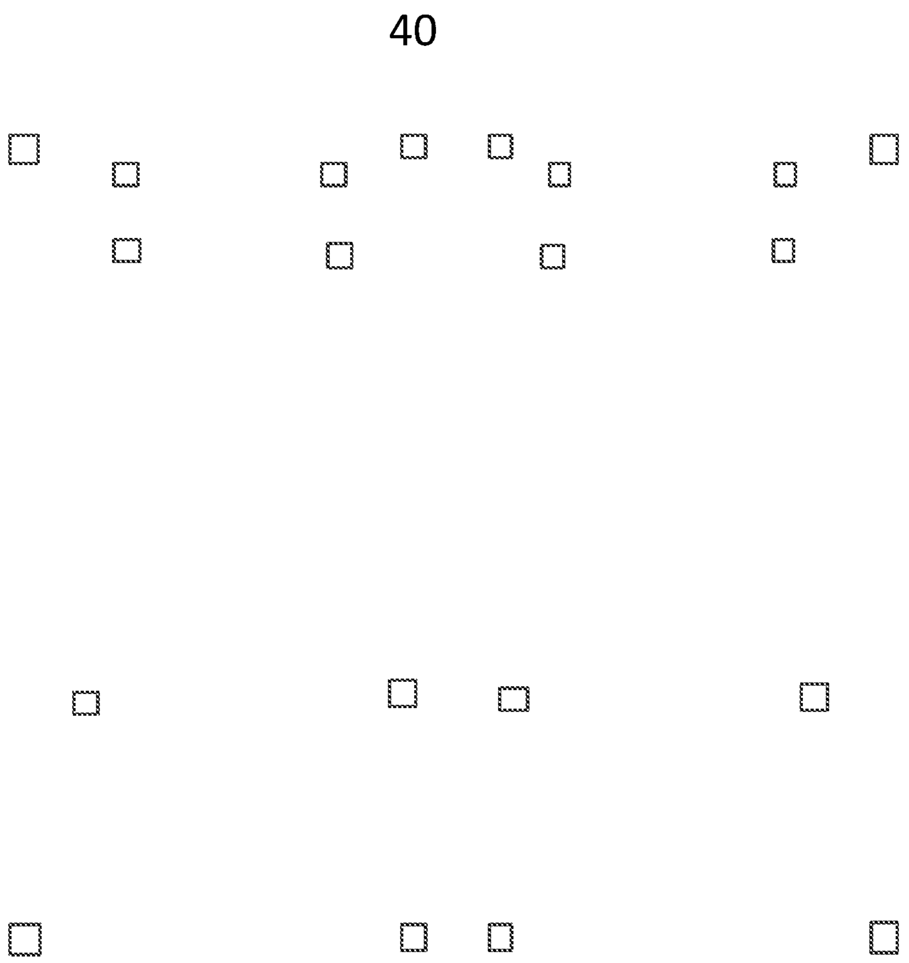
Figure 10E:
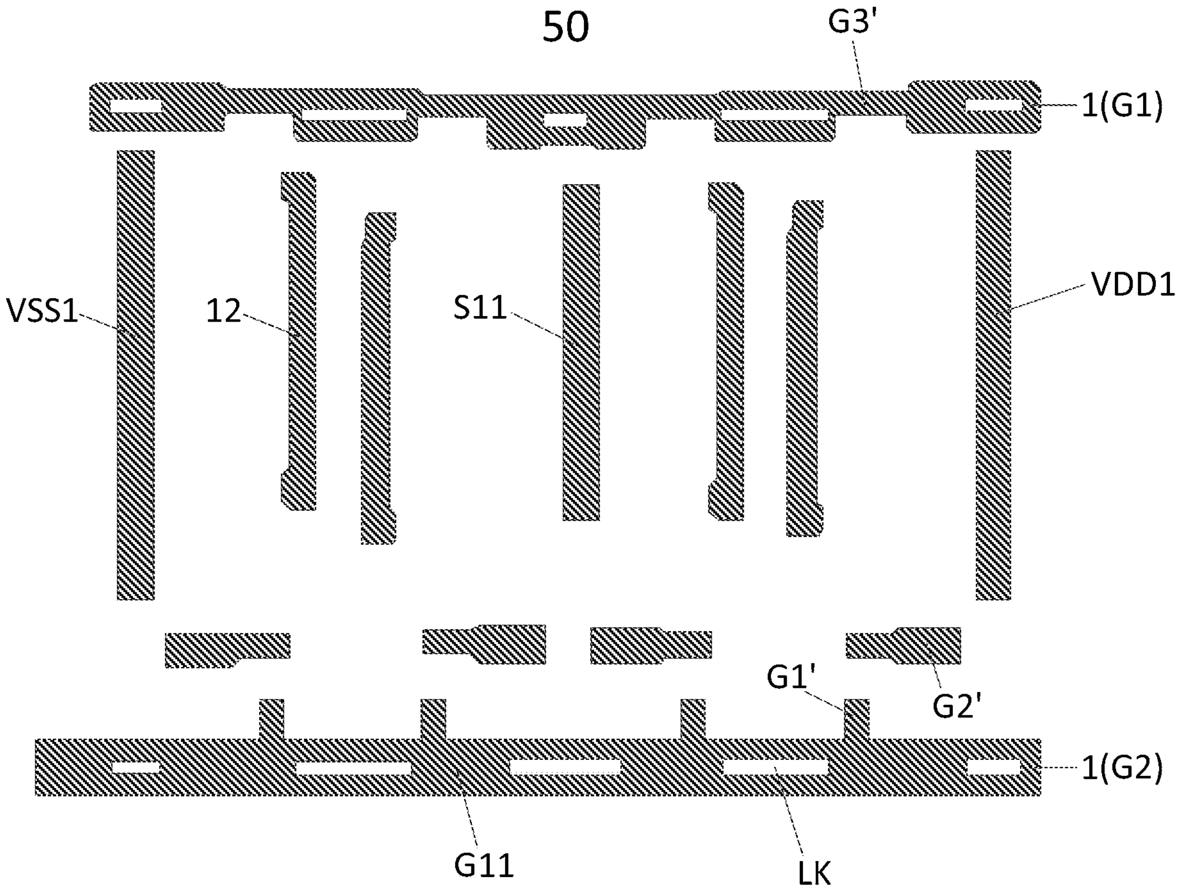
Figure 10F:
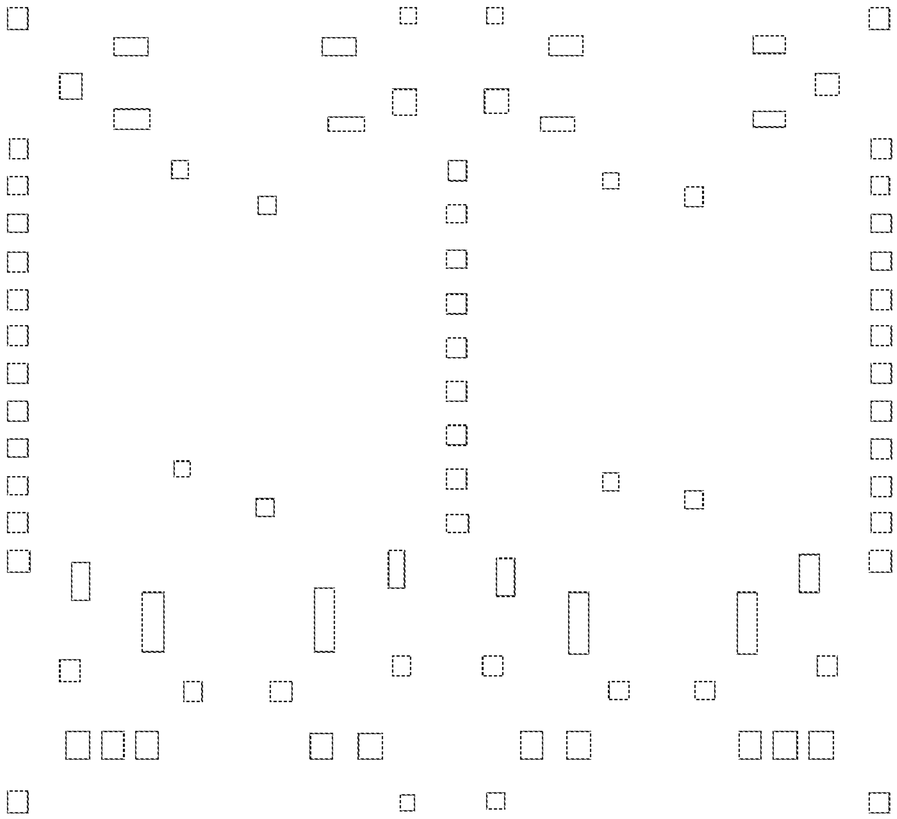
Figure 10G:
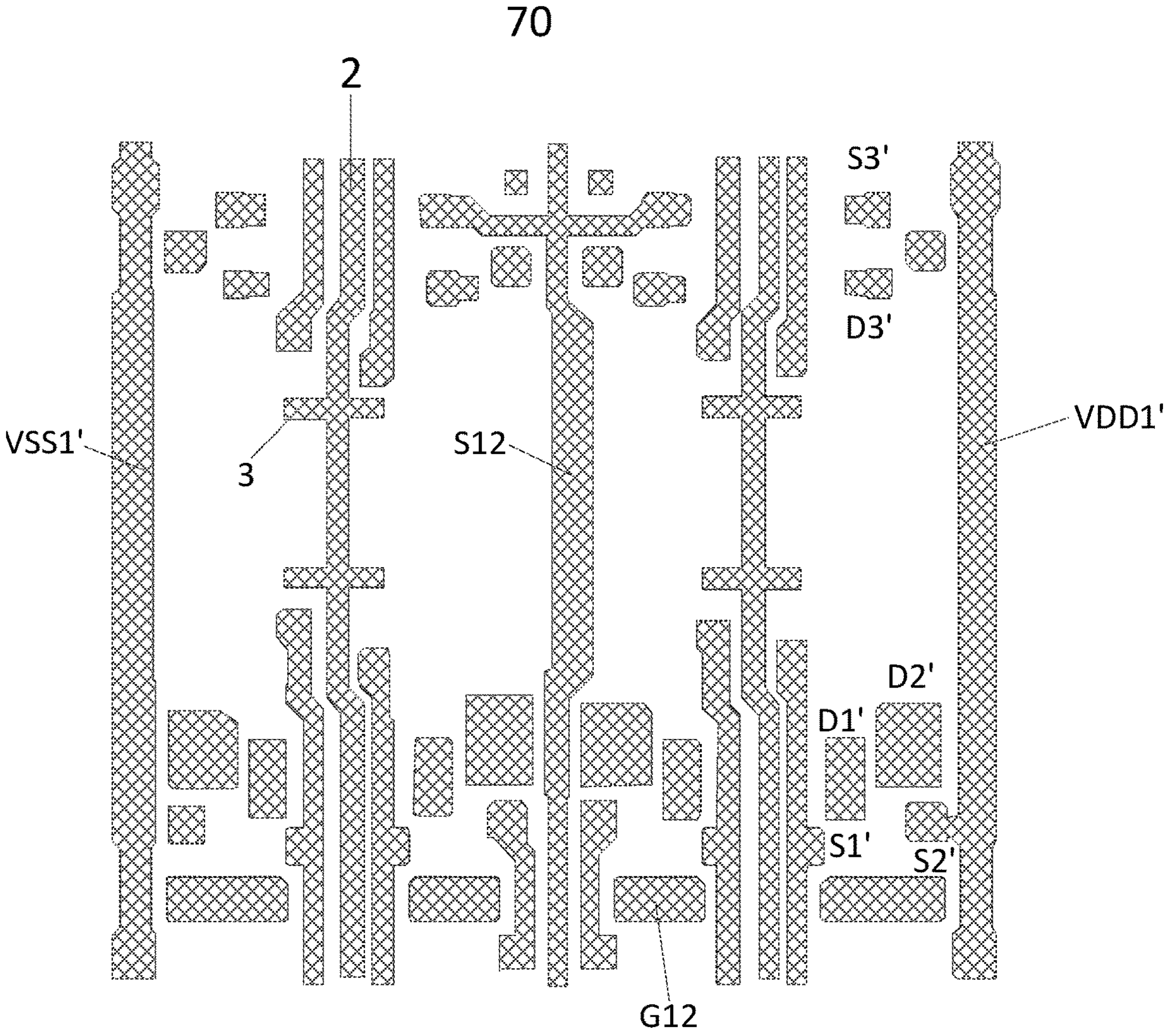
Figure 10H:
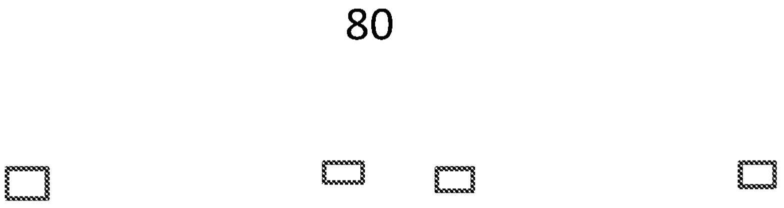
Figure 10I:
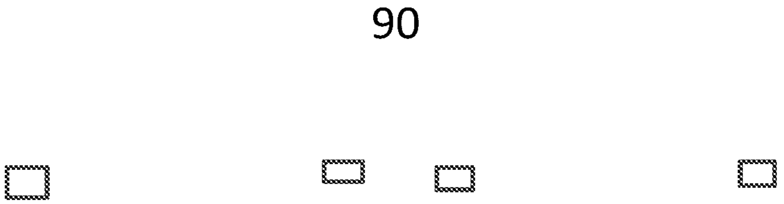
Figure 10J:
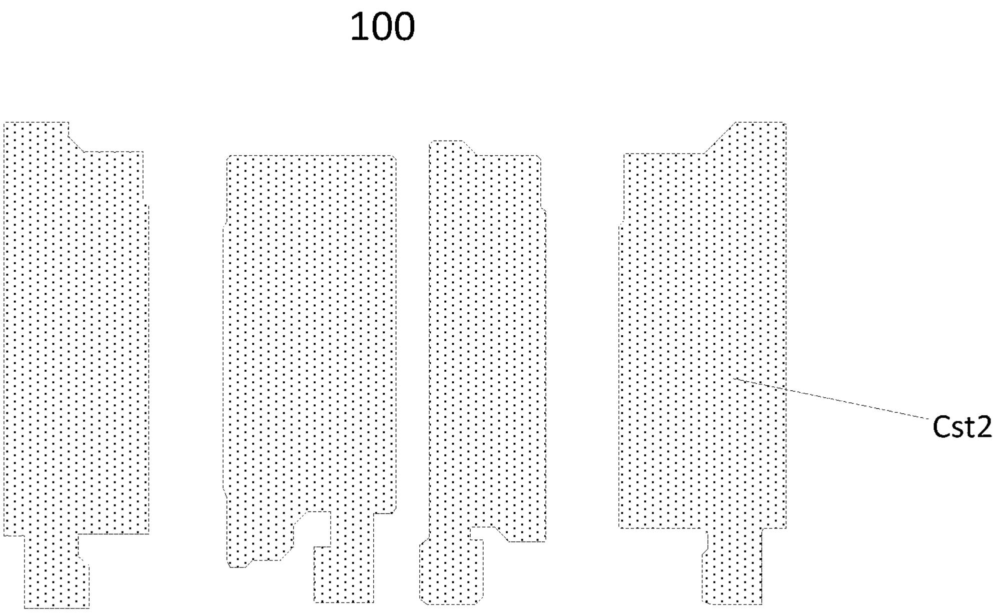
Figure 10K:
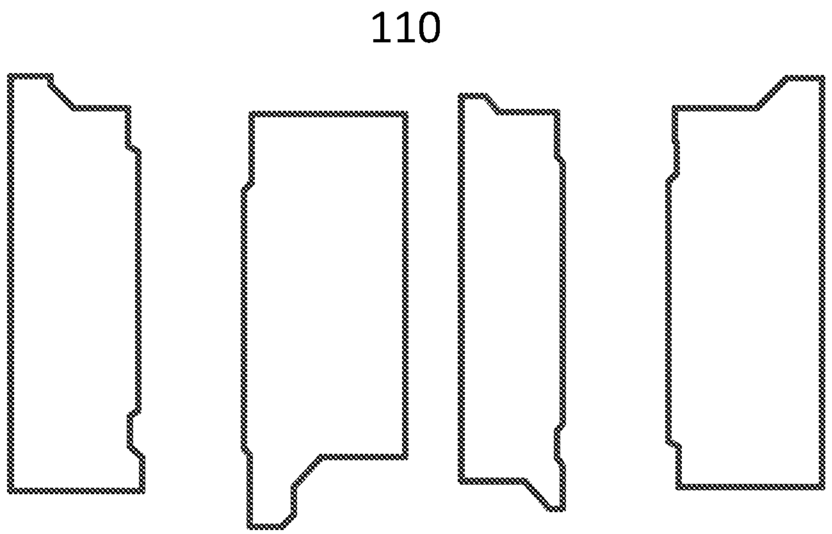

As shown in FIG. 1 and FIGS. 10A to 10K, FIGS. 10A to 10K are separate schematic diagrams of layout for film layers in FIG. 1 respectively. The display panel includes a first conduction layer 10, a light shield metal layer 20, an active layer 30, a gate insulation layer 40, a gate metal layer 50, an interlayer insulation layer 60, a source-drain metal layer 70, a passivation layer 80, a flat layer 90, an anode 100 and a pixel defining layer 110 that are stacked. FIG. 1 shows a stacked structure of these films. FIG. 10A shows a structure of the first conduction layer 10. FIG. 10B shows a structure of the light shield metal layer 20. FIG. 10C shows a structure of the active layer 30. FIG. 10D shows a structure of a via hole of the gate insulation layer 40. FIG. 10E shows a structure of the gate metal layer 50. FIG. 10F shows a structure of a via hole of the interlayer insulation layer 60. FIG. 10G shows a structure of the source-drain metal layer 70. FIG. 10H shows a structure of the via hole of the passivation layer 80. FIG. 10I shows a structure of the via hole of the flat layer 90. FIG. 10J shows a structure of the anode 100. FIG. 10K shows a structure of the pixel defining layer 110.

In some embodiments, as shown in FIGS. 1 and 10A, the first conductive layer 10 may made from ITO, and the first conduction layer 10 mainly includes a first electrode plate Cst1 as the storage capacitor CST in FIG. 9.

In some embodiments, as shown in FIGS. 1 and 10J, the anode 100 made be made from ITO. The anode 100 may be used as the anode of the light-emitting element EL and the second electrode plate Cst2 of the storage capacitor CST in FIG. 9.

In some embodiments, as shown in FIGS. 1 and 10B, the light shield metal layer 20 mainly includes a light shield portion 201, a first adaption portion 202 and a second adaption portion 203. The light shield portion 201 shield the drive circuit shown in FIG. 9 from light, thus better ensuring stability of the transistor structure in the drive circuit and a display effect of the display panel. Alternatively, an orthographic projection of the light shield portion 201 on a substrate may be set to overlap an orthographic projection of a second electrode plate Cst2 of the storage capacitor Cst on the substrate. The light shield portion 201 is coupled to the second electrode plate Cst2 of the storage capacitor CST in the overlapping position. The light shield portion 201 is coupled to the second electrode plate Cst2 of the storage capacitor CST, and the light shield portion 201 has the same potential as the second electrode plate Cst2, thus avoiding influence of a floating state of the light shield portion 201 on working stability of the drive circuit. The first adaption portion 202 extends in the row direction, an orthographic projection of the first adaption portion 202 on the substrate overlaps an orthographic projection of the sensing line S on the substrate, and the first adaption portion 202 is coupled to the sensing line S at the overlapping position. The first adaption portion 202 is coupled to first electrodes of third transistors T3 in the display area. The second adaption portion 203 extends in a first direction, and one end of the second adaption portion 203 is coupled to the first electrode of the second transistor T2. The other end of the second adaption portion 203 is coupled to the first power supply line VDD and receives a power signal provided by the first power supply line VDD.

As shown in FIG. 1, in order to reduce RC loading generated by the first power supply line VDD and improve display quality of the display panel advantageously, the first power supply line VDD includes a first portion VDD1 and a second portion VDD1' that are stacked. The first portion VDD1 and the second portion VDD1' are in the same extension direction as the data line. An orthographic projection of the first portion VDD1 on the substrate overlaps an orthographic projection of the second portion VDD1' on the substrate, and the first portion VDD1 and the second portion VDD1' are coupled through a plurality of via holes 60 provided at the overlapping position. The plurality of via holes 60 may be arranged in sequence in the extension direction of the data line. The first portion VDD1 and the gate line are on the same layer and made from the same material. The second portion VDD1' and the data line are on the same layer and made from the same material.

As shown in FIG. 1, in order to reduce RC loading generated by the second power supply line VSS and improve display quality of the display panel advantageously, the second power supply line VSS includes a third portion VSS1 and a fourth portion VSS1' that are stacked. The third portion VSS1 and the fourth portion VSS1' are in the same extension direction as the data line. An orthographic projection of the third portion VSS1 on the substrate overlaps an orthographic projection of the fourth portion VSS1' on the substrate, and the third portion VSS1 and the fourth portion VSS1' are coupled through a plurality of via holes 60 provided at the overlapping position. The plurality of via holes 60 may be arranged in sequence in the extension direction of the data line. The third portion VSS1 and the gate line are on the same layer and made from the same material. The fourth portion VSS1' and the data line are on the same layer and made from the same material.

As shown in FIG. 1, in order to reduce RC loading generated by the sensing line S and improve display quality of the display panel advantageously in the case that the maintenance line 2 is not arranged adjacent to the sensing line S, the sensing line S may include a fifth portion S11 and a sixth portion S12 that are stacked. The fifth portion S11 and the sixth portion S12 are in the same extension direction as the data line. An orthographic projection of the fifth portion S11 on the substrate overlaps an orthographic projection of the sixth portion S12 on the substrate, and the fifth portion S11 and the sixth portion S12 are coupled through a plurality of via holes 60 provided at the overlapping position. The plurality of via holes 60 may be arranged in sequence in the extension direction of the data line. The fifth portion S11 and the gate line are on the same layer and made from the same material. The sixth portion S12 and the data line are on the same layer and made from the same material.

As shown in FIG. 1, in order to reduce RC loading generated by the gate line and improve display quality of the display panel advantageously, the gate line includes a seventh portion G11 and an eighth portion G12 that are stacked. The seventh portion G11 and the eighth portion G12 are in the same extension direction as the gate line. An orthographic projection of the seventh portion G11 on the substrate overlaps an orthographic projection of the eighth portion G12 on the substrate, and the seventh portion G11 and the eighth portion G12 are coupled through a plurality of via holes 60 provided at the overlapping position. The plurality of via holes 60 may be arranged in sequence in the extension direction of the gate line. The seventh portion G11 is located in the gate metal layer 50. The eighth portion G12 and the data line are on the same layer and made from the same material.

As shown in FIG. 1, in order to reduce a coupling capacitance between the gate line and other signal lines, overlapping areas of the gate line with the data line, the first power supply line, the second power supply line, the sensing line and the maintenance line are set in a hollowed structure LK.

In some embodiments, as shown in FIGS. 1 and 10E, the gate metal layer 50 mainly includes a gate line (G1 and G2), a second connection line 12, the first portion VDD1 of the first power supply line VDD, the third portion VSS1 of the second power supply line VSS, the fifth portion S11 of the sensing line S and the seventh portion G11 of the gate line.

In some embodiments, as shown in FIGS. 1 and 10G, the source to drain metal layer 70 mainly includes the maintenance line 2, the connection bridge 3, the data line (D1, D2, etc.), the second portion VDD1' of the first power supply line, the fourth portion VSS1' of the second power supply line VSS, the sixth portion S12 of the sensing line S, the eighth portion G12 of the gate line, and the first electrodes and the second electrodes of T1 to T3.

In some embodiments, the display panel according to the embodiment of the disclosure may further include other functional film layers that are familiar to those skilled in the art, and merely some of the film layers are described in the disclosure above.

Figure 11:
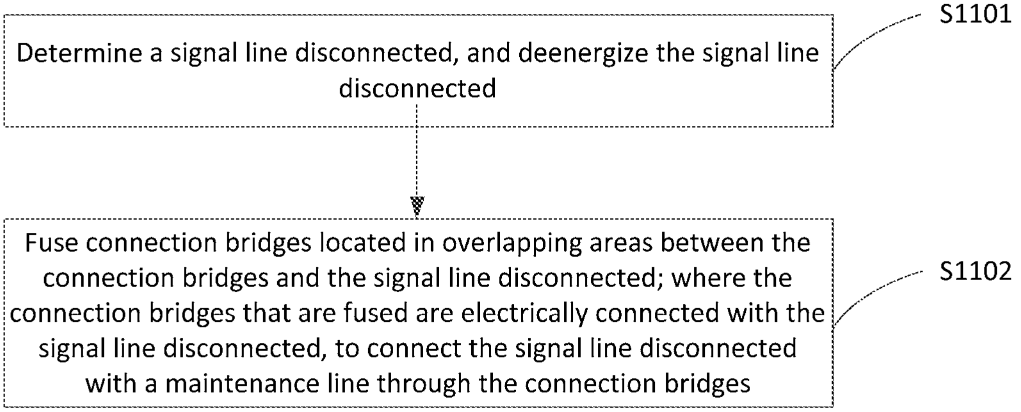
FIG. 11 is a schematic flowchart of a maintenance method for a display panel according to an embodiment of the disclosure.

Based on the same inventive concept, embodiments of the disclosure further provide a maintenance method for a display panel. The maintenance method is configured to maintain any display panel described above as shown in FIG. 11. The maintenance method may include:

S1101, determining a signal line disconnected, and deenergizing the signal line disconnected; and

S1102, fusing connection bridges located in overlapping areas between the connection bridges and the signal line disconnected; where the connection bridges that are fused are electrically connected with the signal line disconnected, to connect the signal line disconnected with a maintenance line through the connection bridges.

According to the maintenance method for a display panel provided by embodiments of the disclosure, when it is determined that the signal line is disconnected, the signal line and the connection bridge can be electrically connected by fusing the connection bridge, and the signal line disconnected can be connected through the maintenance line accordingly. Thus, a yield of the display panel can be greatly increased, and the problem of poor detection caused by disconnection of the signal line can be further solved.

In some embodiments, at the time of the step that connection bridges are fused, the maintenance method according to the embodiment of the disclosure further includes: fusing an insulation layer in the overlapping area between the connection bridges and the signal line disconnected into a via hole; where the connection bridges are electrically connected with the signal line disconnected through the via hole.

In some embodiments, in the maintenance method according to the embodiment of the disclosure, the step that connection bridges are fused includes: fusing the connection bridges through laser irradiation.

Reference can be made to a maintenance method for the signal line in the display panel for the maintenance method provided by embodiments of the disclosure, which will not be repeated herein.

Based on the same inventive concept, embodiments of the disclosure further provide a display apparatus. The display apparatus includes the display panel according to embodiments of the disclosure. Since a principle of solving problems of the display apparatus is similar to that of the aforementioned display panel, reference may be made to implementation of the display panel for implementation of the display apparatus, and any repeated content will not be repeated herein.

According to the display panel, the maintenance method therefor and the display apparatus provided by embodiments of the disclosure, the maintenance line that is adjacent to the signal line and insulated from same is arranged in the display area, and each of the connection bridges electrically connected with the maintenance line has the overlapping area with the adjacent signal line. Thus, when the signal line is not disconnected, the connection bridge and the signal line are arranged in different layers and insulated from each other, and a performance of the signal line is not affected. When the signal line is disconnected, the signal line and the connection bridge can be electrically connected by fusing the connection bridge, and the signal line disconnected can be connected through the maintenance line accordingly. Thus, a yield of the display panel can be greatly increased, and the problem of poor detection caused by disconnection of the signal line can be further solved.

Although the preferred embodiments of the disclosure have been described, additional alterations and modifications can be made to those embodiments by a person of ordinary skill once the basic inventive concept is learned. Thus, the appended claims are intended to be constructed to include the preferred embodiments and all alterations and modifications that fall within the scope of the disclosure.

Apparently, a person of ordinary skill in the art can make various modifications and variations to the embodiments of the disclosure without departing from the spirit and scope of the embodiments of the disclosure. In this way, if these modifications and variations of the embodiments of the disclosure fall within the scope of the claims of the disclosure and their equivalent technologies, the disclosure is also intended to include these modifications and variations.

What is claimed is:

1. A display panel, having a display area and comprising: a plurality of signal lines in the display area; maintenance lines in the display area, wherein an extension direction of the maintenance line is identical to an extension direction of the signal line, and the maintenance line and the signal line are arranged adjacent to each other and insulated from each other; connection bridges in the display area, wherein each of the maintenance lines is at least electrically connected with two of the connection bridges arranged at an interval, each of the connection bridges electrically connected with the maintenance line has an overlapping area with an adjacent signal line, and the connection bridges and the signal lines are arranged in different layers; data lines extending in a column direction, gate lines extending in a row direction, and a sensing line extending in the column direction; wherein the data lines and the gate lines are insulated from each other and crossed to define the plurality of sub-pixels; emitted light colors of the sub-pixels in a same column are identical, and emitted light colors of the sub-pixels in a same row comprise at least three types of colors; and the signal line is at least one of the data line, the gate line and the sensing line; and wherein the signal line comprises at least two first connection lines and at least one second connection line that are arranged in the extension direction of the signal line and are electrically connected; the second connection line is located between the two first connection lines; the connection bridge has an overlapping area with the second connection line; and the connection bridge and the second connection line are arranged in different layers and insulated from each other.

2. The display panel according to claim 1, comprising a plurality of sub-pixels that have different emitted light colors and are distributed in an array in the display area;

wherein the maintenance line and the signal line that are arranged adjacent to each other are located in a gap between two adjacent columns of sub-pixels or a gap between two adjacent rows of sub-pixels.

3. The display panel according to claim 1, wherein the sub-pixels in the same column are electrically connected with the same data line, and sub-pixels in different columns are electrically connected with different data lines; and two data lines electrically connected with two adjacent columns of sub-pixels are located in a gap between the two adjacent columns of sub-pixels, one maintenance line is arranged between the two data lines located in the same gap, and each of connection bridges electrically connected with the maintenance line that is located between the two data lines has overlapping areas with the two data lines.

4. The display panel according to claim 3, wherein the sub-pixels comprise red sub-pixels, green sub-pixels, blue sub-pixels and white sub-pixels, and a red sub-pixel column, a white sub-pixel column, a blue sub-pixel column and a green sub-pixel column are sequentially arranged in the row direction;

two data lines electrically connected with the red sub-pixel column and the white sub-pixel column that are adjacent are located in a gap between the red sub-pixel column and the white sub-pixel column that are adjacent; and two data lines electrically connected with the blue sub-pixel column and the green sub-pixel column that are adjacent are located in a gap between the blue sub-pixel column and the green sub-pixel column that are adjacent.

5. The display panel according to claim 1, wherein two gate lines are arranged between two adjacent rows of sub-pixels; one maintenance line is arranged between the two gate lines; and each of connection bridges electrically connected with the maintenance line that is located between the two gate lines has overlapping areas with the two gate lines.

6. The display panel according to claim 1, wherein the plurality of sub-pixels are divided into a plurality of pixel units, and each of the pixel units comprises sub-pixels in at least three different colors; each column of the pixel units is electrically connected with a same sensing line, and the sensing line is located in a gap between two adjacent columns of sub-pixels; and the maintenance line and the connection bridge that are adjacent are arranged in the gap where the sensing line is located.

7. The display panel according to claim 6, wherein the sensing line and the data line are located in the same gap between two adjacent rows of sub-pixels;

one maintenance line is arranged between the sensing line and the data line that are located in the same gap; and each of connection bridges electrically connected with the maintenance line that is located between the sensing line and the data line that are adjacent has overlapping areas with the sensing line and the data line that are adjacent.

8. The display panel according to claim 1, comprising: a first metal layer, an insulation layer and a second metal layer that are arranged in a stacked manner; wherein under the condition that the signal line is the data line or the sensing line, the first connection line, the maintenance line and the connection bridge are arranged at the second metal layer, the second connection line is arranged at the first metal layer, and the connection bridge is directly electrically connected with the maintenance line.

9. The display panel according to claim 1, comprising: a first metal layer, an insulation layer and a second metal layer that are arranged in a stacked manner; wherein under the condition that the signal line is the data line or the sensing line, the first connection line, the second connection line and the maintenance line are arranged at the second metal layer, the first connection line and the second connection line are in an integrated structure, the connection bridge is arranged at the first metal layer, and the connection bridge and the maintenance line are electrically connected through a via hole that penetrates the insulation layer.

10. The display panel according to claim 1, comprising: a first metal layer, an insulation layer and a second metal layer that are arranged in a stacked manner; wherein under the condition that the signal line is the gate line, the first connection line and the second connection line are arranged at the first metal layer, and the first connection line and the second connection line are in an integrated structure; the connection bridge is arranged at the second metal layer, and the connection bridge and the maintenance line are electrically connected through a via hole that penetrates the insulation layer; and a portion, overlapping the data line and the sensing line, of the maintenance line is arranged at the first metal layer, and a portion, not overlapping the data line and the sensing line, of the maintenance line is arranged at the second metal layer.

11. The display panel according to claim 1, wherein the signal line comprises a plurality of first connection lines and second connection lines that are alternately arranged, and the second connection lines are in one-to-one correspondence to the sub-pixels in position.

12. The display panel according to claim 11, wherein a length of the maintenance line is identical to a length of the signal line.

13. The display panel according to claim 11, wherein the maintenance line comprises a plurality of maintenance sub-lines that are independently arranged in one-to-one correspondence to the sub-pixels, and each of sub-maintenance lines is at least electrically connected with the two connection bridges arranged at an interval.

14. The display panel according to claim 1, wherein an extension direction of the connection bridge and the extension direction of the maintenance line are crossed.

15. A display apparatus, comprising the display panel according to claim 1.

16. A maintenance method for a display panel, configured to maintain the display panel according to claim 1, and comprising:

determining a signal line disconnected, and deenergizing the signal line disconnected; and fusing connection bridges located in overlapping areas between the connection bridges and the signal line disconnected; wherein the connection bridges that are fused are electrically connected with the signal line disconnected, to connect the signal line disconnected with a maintenance line through the connection bridges.

17. The maintenance method according to claim 16, wherein at the time of the fusing the connection bridges, the method further comprises:

fusing an insulation layer in the overlapping area between the connection bridges and the signal line disconnected into a via hole; wherein the connection bridges are electrically connected with the signal line disconnected through the via hole.

18. The maintenance method according to claim 16, wherein the fusing connection bridges comprises:

fusing the connection bridges through laser irradiation.

* * * * *